United States Patent
Cola et al.

(10) Patent No.: US 11,291,139 B2
(45) Date of Patent: Mar. 29, 2022

(54) CARBON NANOTUBE-BASED THERMAL INTERFACE MATERIALS AND METHODS OF MAKING AND USING THEREOF

(71) Applicant: Carbice Corporation, Atlanta, GA (US)

(72) Inventors: Baratunde Cola, Atlanta, GA (US); Leonardo Prinzi, Atlanta, GA (US); Craig Green, Atlanta, GA (US)

(73) Assignee: CARBICE CORPORATION, Atlanta, GA (US)

( * ) Notice: Subject to any disclaimer, the term of this patent is extended or adjusted under 35 U.S.C. 154(b) by 0 days.

(21) Appl. No.: 17/010,440

(22) Filed: Sep. 2, 2020

(65) Prior Publication Data

US 2020/0404809 A1 Dec. 24, 2020

Related U.S. Application Data

(62) Division of application No. 15/603,080, filed on May 23, 2017, now Pat. No. 10,791,651.

(60) Provisional application No. 62/343,458, filed on May 31, 2016.

(51) Int. Cl.
| | |
|---|---|
| *F28F 7/00* | (2006.01) |
| *H05K 7/20* | (2006.01) |
| *H01L 23/373* | (2006.01) |
| *H01L 23/42* | (2006.01) |
| *C01B 32/16* | (2017.01) |
| *C23C 14/06* | (2006.01) |

(52) U.S. Cl.
CPC ......... *H05K 7/20481* (2013.01); *C01B 32/16* (2017.08); *C23C 14/06* (2013.01); *H01L 23/373* (2013.01); *H01L 23/3735* (2013.01); *H01L 23/42* (2013.01); *C01B 2202/24* (2013.01)

(58) Field of Classification Search
CPC .............. H05K 7/20481; H01L 23/373; H01L 23/3735; H01L 23/42; C01B 23/16; C01B 2202/24; C23C 14/06
USPC ........................................................ 165/185
See application file for complete search history.

(56) References Cited

U.S. PATENT DOCUMENTS

| | | | |
|---|---|---|---|
| 2,243,979 | A | 6/1941 | Reynolds |
| 4,876,413 | A | 10/1989 | Vermilyea |
| 5,545,473 | A | 8/1996 | Ameen |
| 6,245,400 | B1 | 6/2001 | Tzeng |
| 6,250,127 | B1 | 6/2001 | Polese |

(Continued)

FOREIGN PATENT DOCUMENTS

| | | |
|---|---|---|
| EP | 2251302 | 11/2010 |
| JP | 2013115094 | 6/2013 |

(Continued)

OTHER PUBLICATIONS

Bayer, et al., Support-Catalyst-Gas interactions during carbon nanotube growth on metallic ta films', J Phys. Chem., 115:4359-69 (2011).

(Continued)

*Primary Examiner* — Claire E Rojohn, III
(74) *Attorney, Agent, or Firm* — Pabst Patent Group LLP

(57) ABSTRACT

Multilayered or multitiered structures formed by stacking of vertically aligned carbon nanotube (CNT) arrays and methods of making and using thereof are described herein. Such multilayered or multitiered structures can be used as thermal interface materials (TIMs).

16 Claims, 12 Drawing Sheets

(56) References Cited

U.S. PATENT DOCUMENTS

| | | | |
|---|---|---|---|
| 6,489,793 B2 | 12/2002 | Jones | |
| 6,636,062 B2 | 10/2003 | Gaasch | |
| 6,921,462 B2 | 7/2005 | Montgomery | |
| 6,965,513 B2 | 11/2005 | Montgomery | |
| 7,086,451 B2 | 8/2006 | Leu | |
| 7,465,605 B2 | 12/2008 | Raravikar | |
| 7,965,514 B2 | 6/2011 | Hill | |
| 7,993,620 B2 | 8/2011 | Lashmore | |
| 8,093,715 B2 | 1/2012 | Xu | |
| 8,128,098 B2 | 3/2012 | Plunkett | |
| 8,220,530 B2 | 7/2012 | Cola | |
| 8,896,335 B2 | 11/2014 | Stuckey | |
| 9,833,772 B2 | 12/2017 | Cola | |
| 2002/0135984 A1 | 9/2002 | Greenwood | |
| 2002/0140336 A1 | 10/2002 | Stoner | |
| 2003/0128519 A1 | 7/2003 | Justo | |
| 2003/0152764 A1 | 8/2003 | Bunyan | |
| 2004/0065717 A1 | 4/2004 | Saijo | |
| 2004/0081843 A1 | 4/2004 | Bunyan | |
| 2004/0105807 A1 | 6/2004 | Fan | |
| 2004/0184981 A1 | 9/2004 | Liu | |
| 2004/0261987 A1 | 12/2004 | Zhang | |
| 2005/0078456 A1 | 4/2005 | Mandel | |
| 2005/0214197 A1 | 9/2005 | Gu | |
| 2005/0228097 A1 | 10/2005 | Zhong | |
| 2006/0073089 A1 | 4/2006 | Ajayan | |
| 2006/0231970 A1 | 10/2006 | Huang | |
| 2006/0251897 A1* | 11/2006 | Pan | H01L 23/373 |
| | | | 428/408 |
| 2007/0253889 A1 | 11/2007 | Awano | |
| 2008/0095695 A1 | 4/2008 | Shanov | |
| 2008/0149166 A1 | 6/2008 | Beeson | |
| 2008/0160866 A1 | 7/2008 | Zhang | |
| 2008/0236804 A1 | 10/2008 | Cola | |
| 2008/0241755 A1 | 10/2008 | Franklin | |
| 2008/0292840 A1 | 11/2008 | Majumdar | |
| 2009/0032496 A1 | 2/2009 | Yao | |
| 2009/0130370 A1 | 5/2009 | Sansom | |
| 2009/0181239 A1 | 7/2009 | Fan | |
| 2009/0246507 A1 | 10/2009 | Graham | |
| 2009/0311166 A1* | 12/2009 | Hart | D01F 9/133 |
| | | | 423/445 B |
| 2009/0325063 A1* | 12/2009 | Albano | H01M 10/0587 |
| | | | 429/188 |
| 2010/0027221 A1 | 2/2010 | Iwai | |
| 2011/0007477 A1* | 1/2011 | Xu | H01L 23/373 |
| | | | 361/718 |
| 2011/0020593 A1 | 1/2011 | Winkler | |
| 2011/0086464 A1 | 4/2011 | Kim | |
| 2011/0308781 A1 | 12/2011 | O'Riordan | |
| 2012/0128880 A1 | 5/2012 | Talapatra | |
| 2012/0155029 A1 | 6/2012 | Wong | |
| 2012/0321961 A1* | 12/2012 | Yushin | B82Y 40/00 |
| | | | 429/231.8 |
| 2013/0234313 A1* | 9/2013 | Wainerdi | H01L 23/373 |
| | | | 257/706 |
| 2013/0294999 A1* | 11/2013 | Liu | B82Y 30/00 |
| | | | 423/447.1 |
| 2014/0015158 A1 | 1/2014 | Cola | |
| 2014/0099493 A1* | 4/2014 | Liu | B82B 3/0033 |
| | | | 428/220 |
| 2014/0116661 A1 | 5/2014 | Xu | |
| 2014/0140008 A1* | 5/2014 | Yamaguchi | H01L 21/4882 |
| | | | 361/705 |
| 2014/0220373 A1 | 8/2014 | Tzou | |
| 2014/0224466 A1* | 8/2014 | Lin | H01L 23/3737 |
| | | | 165/185 |
| 2014/0332193 A1 | 11/2014 | Oh | |
| 2015/0037634 A1 | 2/2015 | Malcolm | |
| 2015/0084182 A1 | 3/2015 | De Cecco | |
| 2015/0111059 A1 | 4/2015 | Tanaka | |
| 2015/0351285 A1 | 12/2015 | Noda | |
| 2015/0360418 A1 | 12/2015 | Shah | |
| 2015/0360948 A1 | 12/2015 | Wei | |
| 2016/0013392 A1 | 1/2016 | Takahashi | |
| 2016/0088720 A1* | 3/2016 | Willis | H01L 23/3677 |
| | | | 361/709 |
| 2016/0104655 A1* | 4/2016 | Kawabata | H01L 23/373 |
| | | | 165/80.2 |
| 2016/0260687 A1* | 9/2016 | Gao | H01L 24/81 |
| 2017/0009918 A1 | 1/2017 | Koves | |
| 2017/0069595 A1 | 3/2017 | Haba | |
| 2017/0108462 A1* | 4/2017 | Chen | B81C 1/00111 |
| 2017/0120220 A1* | 5/2017 | Watanabe | B65B 57/00 |
| 2017/0198551 A1* | 7/2017 | Zhou | C01B 32/16 |
| 2017/0342550 A1* | 11/2017 | Siegal | H01L 23/373 |
| 2017/0347492 A1 | 11/2017 | Cola | |
| 2018/0034492 A1 | 2/2018 | Edgren | |
| 2018/0055529 A1 | 3/2018 | Messerly | |
| 2018/0055531 A1 | 3/2018 | Messerly | |
| 2018/0108594 A1* | 4/2018 | Kondo | H01L 24/11 |
| 2018/0187020 A1* | 7/2018 | Arl | H01B 1/04 |
| 2018/0218847 A1* | 8/2018 | Nguyen | H01M 4/366 |
| 2018/0254236 A1* | 9/2018 | Cola | G01N 25/18 |
| 2018/0318467 A1* | 11/2018 | Esplin | A61K 27/047 |
| 2019/0002284 A1* | 1/2019 | Inoue | B82Y 40/00 |
| 2019/0036186 A1* | 1/2019 | Kim | H01M 4/8867 |
| 2019/0057926 A1* | 2/2019 | Hirose | H01L 23/3733 |
| 2019/0077666 A1* | 3/2019 | Wang | C01B 32/168 |
| 2019/0115278 A1* | 4/2019 | Greenhill | C09D 7/70 |
| 2019/0311970 A1* | 10/2019 | Minami | H01L 23/36 |
| 2019/0323785 A1* | 10/2019 | Eid | H01L 25/0655 |
| 2020/0006614 A1 | 1/2020 | Shibata | |

FOREIGN PATENT DOCUMENTS

| | | |
|---|---|---|
| TW | 201442307 | 11/2014 |
| WO | 2013007645 | 1/2013 |

OTHER PUBLICATIONS

Cola, et al., "Contact mechanics and thermal conductance of carbon nanotube array interfaces", Int. J. Heat Mass Trans., 52:3490-3503 (2009).

Dai, et al., "Controlled growth and modification of vertically-aligned carbon nanotubes for multifunctional applications", Mater. Sci. Eng., 70:63-91 (2010).

Hildreth, et al., "Conformally coating vertically aligned carbon nanotube arrays using thermal decomposition of iron pentacarbonyl", J Vac Sci Technol. B, 30(3):03D1011-03D1013 (2012).

Kim, et al., "Evolution in catalyst morphology leads to carbon nanotube growth termination", J Phys. Chem. Lett, 1:918-22 (2010).

* cited by examiner

CARBON NANOTUBE-BASED THERMAL INTERFACE MATERIALS AND METHODS OF MAKING AND USING THEREOF

CROSS REFERENCE TO RELATED APPLICATIONS

This application is a divisional of pending prior U.S. Ser. No. 15/603,080 filed May 23, 2017, which claims priority to and benefit of U.S. Ser. No. 62/343,458, filed May 31, 2016, which are hereby incorporated herein by reference in their entirety.

FIELD OF THE INVENTION

This invention is in the field of carbon nanotube arrays or sheets, particularly arrays or sheets which are stacked to form multilayered or multitiered structures and methods of making and using thereof.

BACKGROUND OF THE INVENTION

Carbon nanotube (CNT) arrays are an attractive solution for enhancing thermal transport between surfaces. CNTs can be grown on metal substrates, eliminating concerns associated with pump out or voiding that liquid thermal interface materials (TIMs) and greases may suffer from.

The high in-plane conductivity of individual nanotubes (as high as 3,000 W/m-K) means that even at relatively low CNT densities (typical CNT fill factors are on the order of 1%) the cross plane thermal conductance of a CNT-based TIM can be competitive with that of thermal grease.

Furthermore, the favorable deformation mechanics of CNTs allow them to efficiently conform to the asperities of adjoining surfaces, resulting in high contact areas at such interfaces between surfaces.

A key challenge, however, in CNT-based TIMs comes from the difficulty in growing very long CNTs on metal substrates. Unlike CNTs grown on silicon or other inert substrates, the catalyst required for CNT growth suffers from subsurface diffusion when grown on metal substrates, resulting in early termination of tube growth. Furthermore, defects tend to accumulate in CNTs as their height increases, resulting in CNT arrays with conductivities significantly lower than the 3,000 W/m-K limit otherwise achievable with pristine tubes.

Thus, there is a need for overcoming the above mentioned difficulty in growing long CNT arrays on metal substrates and methods of making materials which have good thermal transport properties.

Therefore, it is an object of the invention to provide CNT arrays or sheets and structures formed thereof and methods of making such structures having good thermal transport properties.

It is also an object of the invention to provide CNT arrays or sheets and structures formed thereof which can provide high levels of compliance at the interface with one or more surfaces.

SUMMARY OF THE INVENTION

Multilayered or multitiered structures formed by stacking of vertically aligned carbon nanotube (CNT) arrays and methods of making and using thereof are described herein.

Two or more CNT arrays are typically stacked to form multilayered or multitiered structures. Stacking of multiple CNT arrays, such that the nanostructure elements from opposing arrays form into tiers in the stack and become at least partially interdigitated with one another. Unlike the stacking of a traditional material, stacked arrays of vertically aligned nanostructures do no suffer from a linear (or worse) increase in thermal resistance with increasing thickness. Accordingly, the resulting multilayered structures can mitigate the adverse impact of thickness and boundaries on energy transport as a result of the interdigitation of the nanostructure elements (i.e., CNTs) of the two or more arrays when contacted. In contrast, for a typical material the resistance to heat transfer is directly proportional to the material's thickness, with an additional interfacial resistance at the interfaces of a multilayered structure.

For multilayered or multitiered structures formed by stacking of vertically aligned nanostructure materials of CNT arrays, wherein the CNTs of the arrays at least partially interdigitate within or into one another, effectively increasing the density of the CNTs. Typically, the density of CNTs grown on metal substrates is only about 1% of the total volume. When two adjacent layers of CNT arrays are stacked, for example, the density of heat conducting elements, such as CNTs or structures formed thereof, is effectively doubled. As such the resistance to heat transfer per unit length is reduced in kind.

An advantage of the multilayered or multitiered structures formed by stacking of two or more CNT arrays over traditional bulk materials comes at the interface of the arrays. For example, resistance to heat transfer increases not only due to the increase in thickness of a multilayer stack, but also due to the interfacial resistances between the tiers. Accordingly, between any two adjacent tiers, the boundary between the two tiers is the location of poor heat transfer, relative to the bulk material due to poor contact between the tiers, as well as due to scattering of energy carriers (e.g. electrons or phonons) at the boundary. When interdigitated, the high aspect ratio of the nanostructures, such as CNTs, results in a very high contact area between the tiers minimizing the poor contact area contribution to the inter tier interfacial resistance. Although Kapitza (scattering) resistance cannot be completely eliminated the resistance can be reduced by applying, infiltrating, or backfilling the array or sheet with a polymer, wax, or other secondary material that facilitates thermal/energy transport across the boundary. This transport facilitation may be through the formation of a covalent or weak atomic interaction between the CNT and a secondary material, reduction of acoustic phononic transport mismatch relative to air, or other types of mechanisms.

In one embodiment, nanostructure elements which form the array are vertically aligned carbon nanotubes (CNTs). In some embodiments, the CNT array is grown on a metal substrate which is formed of aluminum, copper or steel or comprises aluminum, copper or steel, or alloys thereof. In another embodiment, the CNT array is formed on a flexible, electrically and thermally conductive substrate, such as graphite. In yet another embodiment, the CNT array is grown on an electrically insulating substrate, such as a flexible ceramic. In one embodiment, the inert support for the CNT array is a piece of metal foil, such as aluminum foil. In some instances only one surface (i.e., side) of the metal foil contains an array of vertically aligned CNTs anchored to the surface or the substrate/support. In other cases, both surfaces (i.e., sides) of the substrate/support, such as a metal foil, contain a coated array of aligned CNTs anchored to the surface. As another example, CNT sheets can be coated on one or both sides and do not require an inert support.

In embodiments described herein two or more CNT arrays are stacked atop one another and the nanostructure elements of the individual arrays, such as the CNTs or some portion thereof, fully or substantially interdigitate within one another; "substantially," as used herein, refers to at least 95%, 96%, 97%, 98%, or 99% interdigitation between the nanostructure elements (i.e., CNTs) of the individual arrays. In some embodiments, the extent of interdigitation is in the range of about 0.1% to 99% or at least about 1%, 5%, 10%, 20%, 30%, 40%, 50%, 60%, 70%, 80%, 90%, or 95%. In certain other embodiments, the two CNT arrays may be interdigitated only at the tips of the nanostructure elements (i.e., CNTs) of the individual arrays. By stacking two or more individual CNT arrays, wherein the nanostructure elements of the individual arrays interdigitate when stacked adjacently, it is possible to form multilayered or multitiered structures.

In certain embodiments, one or more individual nanostructure elements, such as CNTs, of the array may navigate through another when adjacent CNT arrays are brought in contact during the stacking process.

In some embodiments, the individual nanostructure elements, such as CNTs, of the array may interdigitate and form into larger structures, such as superstructures, such as, but not limited to, tube bundles, clumps, or rows. Such superstructures may be formed through mechanisms such as capillary clumping or when a polymer coating has been applied to the CNT arrays prior to, during, or following the stacking process.

In certain embodiments, adjacent tiers formed by stacking of CNT arrays are formed via simple dry contact, using entanglement, friction or weak attraction forces between the nanostructures present therein to keep the resulting interdigitated structure together. In certain other embodiments the stacked structure resulting therefrom may optionally be infiltrated or backfilled with a polymer, wax, liquid metal, or other suitable material that solidifies inside the stacked structure in order to hold the interdigitated arrays together.

In some embodiments the polymer, wax, liquid metal, or other suitable material can reduce the transport resistance between the multiple layers or tiers formed, resulting from improved contact area, a reduction in scattering, or other related mechanisms. In yet other embodiment the tiers formed by stacking of arrays may be bonded by use of an adhesive or a phase-change material.

CNT arrays and the multilayered or multitiered structures formed by stacking of such CNT arrays exhibit both high thermal conductance and mechanical durability. The multilayered or multitiered structures formed by stacking of CNT arrays described herein can be used as thermal interface materials (TIMs). Accordingly, such materials are well suited for applications where repeated cycling is required. For example, they can be employed as thermal interface materials during 'burn-in' testing of electrical components, such as chips. In some embodiments, the inert support/substrate is a surface of a conventional metal heat sink or spreader. This functionalized heat sink or spreader may then be abutted or adhered to a heat source, such as an integrated circuit package. Such TIM materials can also be placed or affixed in between a heat source and a heat sink or heat spreader, such as between an integrated circuit package and a finned heat exchanger, to improve the transfer of heat from the heat source to the heat sink or spreader.

The CNT arrays and the multilayered or multitiered structures formed by stacking of such CNT arrays described herein can be used as thermal interface materials (TIMs) in personal computers, server computers, memory modules, graphics chips, radar and radio-frequency (RF) devices, disc drives, displays, including light-emitting diode (LED) displays, lighting systems, automotive control units, power-electronics, solar cells, batteries, communications equipment, such as cellular phones, thermoelectric generators, and imaging equipment, including MRIs.

In certain embodiments, the multilayered or multitiered structures formed by stacking of CNT arrays are useful as TIMs in low contact pressure and/or low ambient pressure applications, such as in aerospace applications where such TIMs could be used in satellites or space vehicles/systems. In certain embodiments, the multilayered or multitiered structures formed by stacking of CNT arrays are useful at temperatures below ambient, below freezing, or at cryogenic temperatures (such as experienced in space).

The CNT arrays and the multilayered or multitiered structures formed by stacking of such CNT arrays described herein can also be used for applications other than heat transfer. Examples include, but are not limited to, microelectronics, through-wafer vertical interconnect assemblies, and electrodes for batteries and capacitors. Currently, copper and aluminum foil are used as the backing materials for the anode and cathode in lithium ion batteries.

The multilayered or multitiered structures formed by stacking of such CNT arrays could also be used for electromagnetic shielding.

BRIEF DESCRIPTION OF THE DRAWINGS

FIG. 1A shows a schematic of a thermal interface material (TIM) having a single tier, 100, with arrays of carbon nanotubes, 110, on each side of the substrate and wherein the TIM is placed between an electronic device, 200, and a heat sink, 300. FIG. 1B shows a schematic of a thermal interface material (TIM) having three tiers, 100, where the three-tiered TIM is placed between an electronic device, 200, and a heat sink, 300.

DETAILED DESCRIPTION OF THE INVENTION

I. Definitions

Figure 1A:
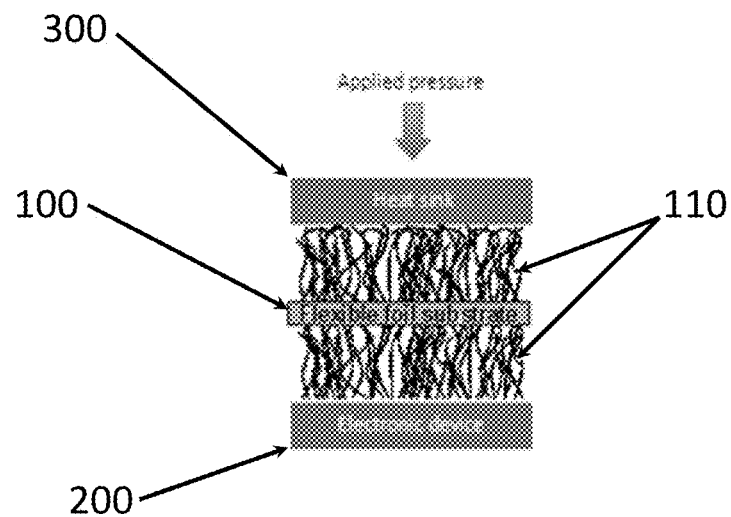
FIGS. 1A and 1B are non-limiting schematics of a multilayered/multitiered structure formed by stacking of carbon nanotube (CNT) arrays.

"Thermal Interface Material" (TIM), as used herein, refers to a material or combination of materials that provide high thermal conductance and mechanical compliance between a heat source and heat sink or spreader to effectively conduct heat away from a heat source.

"Compliant" or "Compliance," as used herein, refers to the ability of a material to conform when contacted to one or more surfaces such that efficient conformance to the asperities of the adjoining surface results in sufficient or high contact areas at the interfaces between the surfaces and the material.

"Interdigitation" or "Interdigitating", as used herein, refers to the ability and or degree which one or more individual nanostructure elements of an array or sheet to infiltrate or penetrate into the adjacent nanostructure elements of another array or sheet when the two different arrays or sheets are contacted or stacked.

"Carbon Nanotube Array" or "CNT array" or "CNT forest", as used herein, refers to a plurality of carbon nanotubes which are vertically aligned on a surface of a material. Carbon nanotubes are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

"Carbon Nanotube Sheet" or "CNT sheet", as used herein, refers to a plurality of carbon nanotubes which are aligned in plane to create a free-standing sheet. Carbon nanotubes are said to be "aligned in plane" when they are substantially parallel to the surface of the sheet that they form. Nanotubes are said to be substantially parallel when they are oriented on average greater than 40, 50, 60, 70, 80, or 85 degrees from sheet surface normal.

"Coating material" as used herein, generally refers to polymers and/or molecules that can bond to CNTs through van der Waals bonds, π-π stacking, mechanical wrapping and/or covalent bonds and bond to metal, metal oxide, or semiconductor material surfaces through van der Waals bonds, π-π stacking, and/or covalent bonds.

"Elastic recovery" as used herein, refers to the ability of a material to return to its original shape following compression, expansion, stretching, or other deformation.

"Compression set" as used herein, refers to the permanent deformation of a material which remains when a force, such as compression, was applied to the material and the force was subsequently removed.

Numerical ranges disclosed in the present application include, but are not limited to, ranges of temperatures, ranges of pressures, ranges of molecular weights, ranges of integers, ranges of conductance and resistance values, ranges of times, and ranges of thicknesses. The disclosed ranges of any type, disclose individually each possible number that such a range could reasonably encompass, as well as any sub-ranges and combinations of sub-ranges encompassed therein. For example, disclosure of a pressure range is intended to disclose individually every possible temperature value that such a range could encompass, consistent with the disclosure herein.

II. Coated Carbon Nanotube Arrays or Sheets

A. Carbon Nanotube Arrays

Carbon nanotube arrays are described herein contain a plurality of carbon nanotubes supported on, or attached to, the surface of an inert substrate/support, such as a metallic (e.g., Al or Au) foil, metal alloys (i.e., steel). In some embodiments, the substrate/support can be a flexible, electrically, and thermally conductive substrate, such as graphite or other carbon-based material. In yet other embodiments, the substrate/support can be an electrically insulating substrate such as a flexible ceramic. The CNT arrays can be formed using the methods described below. The CNTs are vertically aligned on the substrate/support. CNTs are said to be "vertically aligned" when they are substantially perpendicular to the surface on which they are supported or attached. Nanotubes are said to be substantially perpendicular when they are oriented on average within 30, 25, 20, 15, 10, or 5 degrees of the surface normal.

Generally, the nanotubes are present at a sufficient density such that the nanotubes are self-supporting and adopt a substantially perpendicular orientation to the surface of the multilayer substrate. Preferably, the nanotubes are spaced at optimal distances from one another and are of uniform height to minimize thermal transfer losses, thereby maximizing their collective thermal diffusivity.

The CNT arrays contain nanotubes which are continuous from the top of the array (i.e., the surface formed by the distal end of the carbon nanotubes when vertically aligned on the multilayer substrate) to bottom of the array (i.e., the surface of the multilayer substrate). The array may be formed from multi-wall carbon nanotubes (MWNTs), which generally refers to nanotubes having between approximately 4 and approximately 10 walls. The array may also be formed from few-wall nanotubes (FWNTs), which generally refer to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 10 to 40 nm, more preferably 15 to 30 nm, most preferably about 20 nm. The length of CNTs in the arrays can range from 1 to 5,000 micrometers, preferably 5 to 5000 micrometers, preferably 5 to 2500 micrometers, more preferably 5 to 2000 micrometers, more preferably 5 to 1000 micrometers. In some embodiments, the length of CNTs in the arrays can range from 1-500 micrometers, even more preferably 1-100 micrometers.

The CNTs display strong adhesion to the multilayer substrate. In certain embodiments, the CNT array or sheet will remain substantially intact after being immersed in a solvent, such as ethanol, and sonicated for a period of at least five minutes. In particular embodiments, at least about 90%, 95%, 96%, 97%, 98%, 99%, or 99.9% of the CNTs remain on the surface after sonication in ethanol.

B. Carbon Nanotube Sheets

Carbon nanotube sheets are also described herein. The sheets contain a plurality of carbon nanotubes that support each other through strong van der Waals force interactions and mechanical entanglement to form a freestanding material. The CNT sheets can be formed using the methods described below. The CNTs form a freestanding sheet and are aligned in plane with the surface of this sheet. CNTs are said to be "aligned in plane" when they are substantially parallel to the surface of the sheet that they form. Nanotubes are said to be substantially parallel when they are oriented on average greater than 40, 50, 60, 70, 80, or 85 degrees from sheet surface normal.

Generally, the nanotubes are present at a sufficient density such that the nanotubes are self-supporting and adopt a substantially parallel orientation to the surface of the sheet. Preferably, the nanotubes are spaced at optimal distances from one another and are of uniform length to minimize thermal transfer losses, thereby maximizing their collective thermal diffusivity.

The CNT sheets may be formed from multi-wall carbon nanotubes (MWNTs), which generally refers to nanotubes having between approximately 4 and approximately 10 walls. The sheets may also be formed from few-wall nanotubes (FWNTs), which generally refers to nanotubes containing approximately 1-3 walls. FWNTs include single-wall carbon nanotubes (SWNTs), double-wall carbon nanotubes (DWNTS), and triple-wall carbon nanotubes (TWNTs). In certain embodiments, the nanotubes are MWNTs. In some embodiments, the diameter of MWNTs in the arrays ranges from 10 to 40 nm, more preferably 15 to 30 nm, most preferably about 20 nm. The length of CNTs in the sheets can range from 1 to 5,000 micrometers, preferably 100 to 5000 micrometers, preferably 500 to 5000 micrometers, more preferably 1000 to 5000 micrometers. In some embodiments, the length of CNTs in the sheets can range from 1-500 micrometers, even more preferably 1-100 micrometers.

C. Coating(s)/Coating Materials

The CNT array or sheet can include a coating or coating material (terms can be used interchangeably) which adheres or is bonded to the CNTs. The coating/coating material can be applied as described below. In some embodiments, the coating contains one or more oligomeric materials, polymeric materials, waxes, or combinations thereof. In other embodiments, the coating contains one or more non-polymeric materials. In some embodiments, the coating can contain a mixture of oligomeric, waxes, and/or polymeric material and non-polymeric materials.

In certain embodiments, the coating material(s) act as a bonding agent(s) which can bonded, such as chemically, the carbon nanotubes of the stacked arrays or sheets. Without limitation, such coating material(s) which can act as bonding agents(s) can be selected from adhesives (i.e., acrylate adhesives) and a phase change material (i.e., a wax or waxes).

In some embodiments, the coating which adheres or is bonded to the CNTs of an array is applied before two or more CNT arrays or sheets are stacked while in other embodiments, the coating which adheres or is bonded to the CNTs of an array is applied following stacking of two or more CNT arrays or sheets. In yet other embodiments, the coating is infiltrated or backfilled into multilayered or multitiered structures formed of stacked CNT arrays or sheets and adheres or is bonded to the CNTs of the arrays forming the structure. As used herein, "infiltration" or "infiltrated" refer to a coating material(s) which are permeated through at least some of the carbon nanotubes of the arrays or sheets which were stacked to form the multilayered or multitiered structures. In some embodiments, the extent of infiltration is in the range of 0.1-99.9%. In some embodiments, the infiltrated coating material at least partially fills the interstitial space between carbon nanotubes while in some other embodiments the infiltrated coating coats at least some of the surfaces of the carbon nanotubes, or both. In some embodiments, the infiltrated coating material fills the all or substantially all (i.e., at least about 95%, 96%, 97%, 98%, or 99%) of the interstitial space between carbon nanotubes present in the tiers or layers of the structure formed by stacking of the CNT arrays or sheets.

A variety of materials can be coated onto the CNT arrays or sheets, prior to stacking, during stacking, or following stacking. In particular embodiments, the coatings can cause a decrease in the thermal resistance of the CNTs of arrays or sheets of structure having a plurality of layers or tiers, as defined herein. The coatings can be applied conformally to coat the tips and/or sidewalls of the CNTs. It is also desirable that the coating be reflowable as the interface is assembled using, for example, solvent, heat or some other easy to apply source. Polymers used as coatings must be thermally stable up to at least 130° C. In some embodiments, the coating is readily removable, such as by heat or dissolution in a solvent, to allow for "reworking" of the interface. "Reworking", as used herein, refers to breaking the interface (i.e., removing the coating) by applying solvent or heat.

1. Polymeric Coating Materials

In some embodiments, the coating is, or contains, one or more polymeric materials. The polymer coating can contain a conjugated polymer, such as an aromatic, heteroaromatic, or non-aromatic polymer, or a non-conjugated polymer.

Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic, conjugated polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT). In other embodiments, the polymer is poly(3,4-3thylenedioxythiophene) (PEDOT) or poly(3,4-3thylenedioxythiophene) poly(styrenesulfonate) (PEDOT:PSS).

In other embodiments, the polymer is a non-conjugated polymer. Suitable non-conjugated include, but are not limited to, polyvinyl alcohols (PVA), poly(methyl methacrylates) (PMMA), polydimethylsiloxanes (PDMS), polyurethane, silicones, acrylics, and combinations (blends) thereof.

In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, or 120° C., preferably above 130° C.

In other embodiments, the polymer is an adhesive, such as, but not limited to, a hot glue or hot melt adhesive that combines wax, tackifiers and a polymer base to provide improved adhesion properties to one or more surfaces. In some embodiments, the adhesive is a pressure sensitive adhesive. In certain other embodiments, the adhesive is a monomer that polymerizes upon contact with air or water such as a cyanoacrylate. In yet other embodiments, the adhesive is a combination of a pressure sensitive adhesive and a thermally activated (or activatable) adhesive polymers which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

D. Other Coating Materials

1. Metallic Nanoparticles

The CNT arrays or sheets can additionally be coated with one or more metal nanoparticles. One or more metal nanoparticles may be adsorbed to the distal ends and/or sidewalls of the CNTs to bond the distal ends and/or sidewalls of the CNTs to a surface, reduce thermal resistance between the CNT array or sheet and a surface, or combinations thereof. Metal nanoparticles can be applied to CNT arrays or sheets using a variety of methods known in the art.

Examples of suitable metal nanoparticles include palladium, gold, silver, titanium, iron, nickel, copper, and combinations thereof.

2. Flowable or Phase Change Materials

In certain embodiments, flowable or phase change materials are applied to the CNT arrays or sheets prior to stacking, during stacking, or following stacking. Flowable or phase change materials may be added to the CNT array or sheet to displace the air between CNTs and improve contact between the distal ends and/or sidewalls of CNTs and a surface, and as a result reduce thermal resistance of the array or sheet and the contact between the array or sheet and a surface, or combinations thereof. Flowable or phase change materials can be applied to CNT arrays using a variety of methods known in the art.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material, such as a non-polymeric coating material and the flowable or phase change material are the same material or materials.

III. Multilayered or Multitiered Structures

Figure 2:
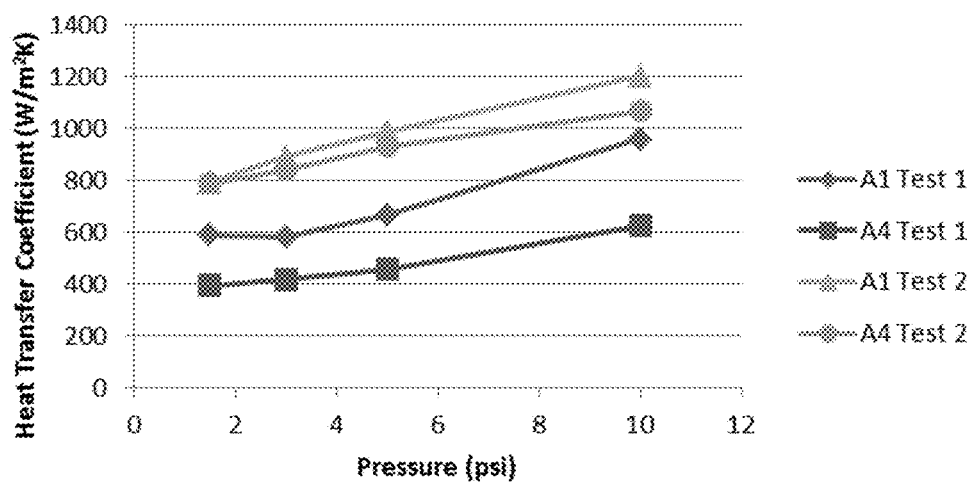
FIG. 2 is a graph showing the heat transfer coefficient for dry stacks of three TIMs on aluminum (Al) substrates over two test cycles.

The CNT arrays or sheets described above can be stacked according to the methods described below to afford multi-layered or multitiered structures. A non-limiting example of a three layered/tiered structure is shown in the schematic of FIG. 2 (right side). A layer or tier is formed by contacting/stacking the carbon nanotubes of two CNT arrays or sheets, which interdigitate at least partially, and which may optionally be coated with a suitable coating material as described herein.

In some embodiments the multilayered or multitiered structures can further include a coating, a coating of metallic nanoparticles, and/or a coating of flowable or phase change materials on the nanostructure elements, such as CNTs, of the arrays.

At least two CNT arrays or sheets can be stacked to form the multilayered or multitiered structures. For example, FIG. 2 shows stacking of three CNT arrays (right side). By using more CNT arrays the thickness of the multilayered or multitiered structures can be increased as needed. In some embodiments, up to 5, 10, 15, 20, 25, 30, or more CNT arrays or sheets can be stacked according to the method described above. The thickness of the resulting multilayered or multitiered structures formed by stacking can be in the range 1-10,000 microns or more. In some embodiments, the thickness of the resulting multilayered or multitiered structures formed by stacking can be 1-3,000 micrometers, even more preferably 70-3,000 micrometers. In some embodiments, the number of layers and/or thickness is based on the thickness of the CNT forest formed on the arrays used in the stacking process.

In a non-limiting embodiment, at least two vertically aligned arrays or sheets formed on supports/substrates are stacked/contacted such that the nanostructure elements, such as CNTs, of the arrays at least partially interdigitate on contact. In one embodiment full interdigitation of nanostructure elements of the arrays occurs within one another when stacked. In other embodiments the arrays may interdigitate only at the tips of the nanostructure elements, such as CNTs. In yet other embodiments, the individual nanostructures can navigate through the nanostructures of the adjacent array during the interdigitating process and the nanostructure elements of the individual arrays, such as the CNTs or some portion thereof, fully or substantially interdigitate within one another; "substantially," as used herein, refers to at least 95%, 96%, 97%, 98%, or 99% interdigitation between the nanostructure elements of the individual arrays. In some embodiments, the extent of interdigitation is in the range of about 0.1% to 99% or at least about 1%, 5%, 10%, 20%, 30%, 40%, 50%, 60%, 70%, 80%, 90%, or 95%.

In some embodiments the nanostructures of the stacked arrays, which interdigitate at least partially, may also form into larger superstructures, such as, but not limited to, tube bundles, clumps, or rows. These superstructures may be formed through mechanisms such as capillary clumping or by way of application of a polymer coating prior to, during, or following the stacking process.

In some embodiments, a polymer coating and/or adhesive, or other coating as described above, is applied to the CNT array(s) which are subsequently stacked. In such embodiments, the thickness of the coating and/or adhesive, or other coating as described above, is about 1-1000 nm, more preferable 1-500 nm, and most preferably 1-100 nm.

In addition to the above, the favorable deformation mechanics of CNTs present in the multilayered or multitiered structures allow them to efficiently conform to the asperities of adjoining surfaces, resulting in high contact areas at the interfaces.

A. Reduction in Thermal Resistance

The CNT arrays or sheets and the multilayered or multitiered structures formed by stacking of such CNT arrays described herein exhibit reduced thermal resistance. The thermal resistance can be measured using a variety of techniques known in the art, such as the photoacoustic (PA) method.

In one embodiment, the thermal resistance of the CNT arrays or sheets and the multilayered or multitiered structures formed by stacking of such CNT arrays or sheets is reduced by at least about 25%, 30%, 35%, 40%, 45%, 50%, 55%, 60%, 65%, 70% or greater compared to single tiered structures when measured, for example, using the photoacoustic method. In certain embodiments, the CNT arrays or sheets and the multitiered or multitiered structures formed by stacking of such CNT arrays or sheets exhibit thermal resistances of less than about 1.0, 0.9, 0.8, 0.7, 0.6, 0.5, 0.4, 0.3, 0.2, or 0.1 $cm^2$ K/W. In such embodiments, the thermal resistance is about 0.4, preferably about 0.3 $cm^2$ K/W. In certain embodiments, the CNT arrays or sheets and the multilayered or multitiered structures formed by stacking of such CNT arrays or sheets exhibit thermal resistances of between about 1 and 0.1 cm² K/W. In such embodiments, the thermal resistance is about 1, 0.9, 0.8, 0.7, 0.6, 0.5, 0.4, 0.3, 0.2, or 0.1 cm² K/W. In some embodiments, the thermal resistance value of a multilayered or multitiered structures formed by stacking of CNT arrays or sheets is the same or substantially unchanged as compared to the value(s) of the single layer arrays used to form the stack; "substantially," as used herein refers to less than a 10%, 5%, 4%, 3%, 2%, or 1% change.

In some instances, the multilayered or multitiered structures formed by stacking of CNT arrays or sheets, when used, for example, as thermal interface materials (TIMs) exhibit thermal resistance hysteresis and stable operation over a wide pressure range of 0 to 500 psi, 0 to 400 psi, 0 to 300 psi, 0 to 200 psi, or 0 to 100 psi, when increasing and decreasing the pressure on the TIM in the aforementioned ranges.

In one embodiment, the apparent thermal conductivity of the CNT arrays or sheets and the multilayered or multitiered structures formed by stacking of such CNT arrays or sheets is increased by at least about 25%, 30%, 35%, 40%, 45%, 50%, 55%, 60%, 65%, 70% or greater compared to single tiered structures. In some embodiments, the CNT arrays or sheets and the multilayered or multitiered structures formed by stacking of such CNT arrays or sheets exhibit conductance values in the range of about 1-2500 W/m-K, 1-2000 W/m-K, 1-1500 W/m-K, 1-1000 W/m-K, 1-500 W/m-K, 5-500 W/m-K, 5-400 W/m-K, 5-300 W/m-K, 5-200 W/m-K, 5-150 W/m-K, 5-100 W/m·K, or 3-30 W/m-K.

A coating may be optionally applied to the CNT arrays or sheets prior to, during, or following stacking to form multilayered or multitiered structures formed by stacking of such CNT arrays or sheets. Coating(s) were shown to be an effective means for increasing the contact area and reducing the thermal resistance of CNT forest thermal interfaces. The bonding process added by inclusion of nanoscale coatings around individual CNT contacts includes, for example, pulling, through capillary action, of additional CNTs close to the interface to increase contact area.

The multilayered or multitiered structures, demonstrate good compliance, i.e., the ability to conform when contacted to one or more surfaces of material(s) (such as a die or chip). Compliant multilayered or multitiered TIMs have contact areas at interfaces between surface(s) of material(s) and the TIM, such that the compliance of the multilayered or multitiered TIMs, expressed as a percentage value, is between about 1% to 50%, 1% to 40%, 1% to 30%, 1% to 25%, 1% to 20%, or 1% to 10% of the total thickness of the TIM.

The multilayered or multitiered structures also demonstrate excellent elastic recovery properties following one or more repeated deformations, typically compressions, at varying pressures up to about 50, 100, 200, 300, 400, 500 psi, or greater (see Example data). Elastic recovery of the multilayered or multitiered structures, expressed as a percentage value, following one or more compressions can be greater than about 50%, 60%, 70%, 80%, 90%, 91%, 92%, 93%, 94%, 95%, 96%, 97%, 98%, or 99%. In some instances, the multilayered or multitiered structures described also demonstrate compression set properties following one or more repeated deformations, typically compressions, at varying pressures up to about 50, 100, 200, 300, 400, 500 psi, or greater. Compression set of the multilayered or multitiered structures, expressed as a percentage value, following one or more compressions can be less than about 20%, 15%, 10%, 9%, 8%, 7%, 6%, 5%, 4%, 3%, 2%, 1%, 0.9%, 0.8%, 0.7%, 0.6%, 0.5%, 0.4%, 0.3%, 0.2%, or 0.1%.

IV. Methods for Preparing Multilayered or Multitiered Structures

A. Carbon Nanotube Arrays

Carbon nanotube arrays can be prepared using techniques well known in the art. In one embodiment, the arrays are prepared as described in U.S. Publication No. 2014-0015158-A1, incorporated herein by reference. This method involves the use of multilayer substrates to promote the growth of dense vertically aligned CNT arrays and provide excellent adhesion between the CNTs and metal surfaces.

The multilayer substrates contain three or more layers deposited on an inert support, such as a metal surface. Generally, the multilayer substrate contains an adhesion layer, an interface layer, and a catalytic layer, deposited on the surface of an inert support. Generally, the support is formed at least in part from a metal, such as aluminum, platinum, gold, nickel, iron, tin, lead, silver, titanium, indium, copper, or combinations thereof. In certain instances, the support is a metallic foil, such as aluminum or copper foil. The support may also be a surface of a device, such as a conventional heat sink or heat spreader used in heat exchange applications.

The adhesion layer is formed of a material that improves the adhesion of the interface layer to the support. In certain embodiments, the adhesion layer is a thin film of iron. Generally, the adhesion layer must be thick enough to remain a continuous film at the elevated temperatures used to form CNTs. The adhesion layer also generally provides resistance to oxide and carbide formation during CNT synthesis at elevated temperatures.

The interface layer is preferably formed from a metal which is oxidized under conditions of nanotube synthesis or during exposure to air after nanotube synthesis to form a suitable metal oxide. Examples of suitable materials include aluminum. Alternatively, the interface layer may be formed from a metal oxide, such as aluminum oxide or silicon oxide. Generally, the interface layer is thin enough to allow the catalytic layer and the adhesion layer to diffuse across it. In some embodiments wherein the catalytic layer and the adhesion layer have the same composition, this reduces migration of the catalyst into the interface layer, improving the lifetime of the catalyst during nanotube growth.

The catalytic layer is typically a thin film formed from a transition metal that can catalyze the formation of carbon nanotubes via chemical vapor deposition. Examples of suitable materials that can be used to form the catalytic layer include iron, nickel, cobalt, rhodium, palladium, and combinations thereof. In some embodiments, the catalytic layer is formed of iron. The catalytic layer is of appropriate thickness to form catalytic nanoparticles or aggregates under the annealing conditions used during nanotube formation.

In other embodiments, the multilayer substrate serves as catalytic surface for the growth of a CNT array. In these instances, the process of CNT growth using chemical vapor deposition alters the morphology of the multilayer substrate. Specifically, upon heating, the interface layer is converted to a metal oxide, and forms a layer or partial layer of metal oxide nanoparticles or aggregates deposited on the adhesion layer. The catalytic layer similarly forms a series of catalytic nanoparticles or aggregates deposited on the metal oxide nanoparticles or aggregates. During CNT growth, CNTs form from the catalytic nanoparticles or aggregates. The resulting CNT arrays contain CNTs anchored to an inert support via an adhesion layer, metal oxide nanoparticles or aggregates, and/or catalytic nanoparticles or aggregates.

In particular embodiments, the multilayer substrate is formed from an iron adhesion layer of about 30 nm in thickness, an aluminum or alumina interface layer of about 10 nm in thickness, and an iron catalytic layer of about 3 nm in thickness deposited on a metal surface. In this embodiment, the iron adhesion layer adheres to both the metal surface and the Al (alumina nanoparticles or aggregates after growth) or $Al_2O_3$ interface layer. The iron catalytic layer forms iron nanoparticles or aggregates from which CNTs grow. These iron nanoparticles or aggregates are also bound to the alumina below.

As a result, well bonded interfaces exist on both sides of the oxide interface materials. Of metal/metal oxide interfaces, the iron-alumina interface is known to be one of the strongest in terms of bonding and chemical interaction. Further, metals (e.g., the iron adhesion layer and the metal surface) tend to bond well to each other because of strong electronic coupling. As a consequence, the CNTs are strongly anchored to the metal surface.

Further, subsurface diffusion of iron from the catalytic layer during nanotube growth is reduced because the same metal is on both sides of the oxide support, which balances the concentration gradients that would normally drive diffusion. Therefore, catalyst is not depleted during growth, improving the growth rate, density, and yield of nanotubes in the array.

In some embodiments, the CNT array is formed by vertically aligning a plurality of CNTs on the multilayer substrate described above. This can be accomplished, for example, by transferring an array of CNTs to the distal ends of CNTs grown on the multilayer substrate. In some embodiments, tall CNT arrays are transferred to the distal ends of very short CNTs on the multilayer substrate. This technique improves the bond strength by increasing the surface area for bonding.

The inert support for the CNT array or sheet can be a piece of metal foil, such as aluminum foil. In these cases, CNTs are anchored to a surface of the metal foil via an adhesion layer, metal oxide nanoparticles or aggregates, and catalytic nanoparticles or aggregates. In some instances only one surface (i.e., side) of the metal foil contains an array or sheet of aligned CNTs anchored to the surface. In other cases, both surfaces (i.e., sides) of the metal foil contain an array or sheet of aligned CNTs anchored to the surface. In other embodiments, the inert support for the CNT array or sheet is a surface of a conventional metal heat sink or heat spreader. In these cases, CNTs are anchored to a surface of the heat sink or heat spreader via an adhesion layer, metal oxide nanoparticles or aggregates, and catalytic nanoparticles or aggregates. This functionalized heat sink or heat spreader may then be abutted or adhered to a heat source, such as an integrated circuit package.

B. Carbon Nanotube Sheets

Carbon nanotube sheets can be prepared using techniques well known in the art. In one embodiment, the sheets are prepared as described in U.S. 7,993,620 B2. In this embodiment, CNT agglomerates are collected into sheets in-situ inside the growth chamber on metal foil substrates. The sheets can then be densified by removing the solvent. In another embodiment, the CNT sheets are made by vacuum filtration of CNT agglomerates that are dispersed in a solvent.

C. Coated Nanotube Arrays and Sheets

1. Polymer Coatings

Polymers to be coated can be dissolved in one or more solvents and spray or dip coated or chemically or electrochemically deposited onto the vertical CNT forests or arrays grown on a substrate, or on a sheet, as described above. The coating materials can also be spray coated in powder form onto the top of vertical CNT forests or arrays grown on a substrate, or on CNT sheets as described above. The coatings includes polymers or molecules that bond to CNTs through van der Waals bonds, π-π stacking, mechanical wrapping and/or covalent bonds and bond to metal, metal oxide, or semiconductor material surfaces through van der Waals bonds, π-π stacking, and/or covalent bonds.

For spray or dip coating, coating solutions can be prepared by sonicating or stirring the coating materials for a suitable amount of time in an appropriate solvent. The solvent is typically an organic solvent or solvent and should be a solvent that is easily removed, for example by evaporation at room temperature or elevated temperature. Suitable solvents include, but are not limited to, chloroform, xylenes, hexanes, pyridine, tetrahydrofuran, ethyl acetate, and combinations thereof. The polymer can also be spray coated in dry form using powders with micron scale particle sizes, i.e., particles with diameters less than about 100, 50, 40, 20, 10 micrometers. In this embodiment, the polymer powder would need to be soaked with solvent or heated into a liquid melt to spread the powder particles into a more continuous coating after they are spray deposited.

The thickness of the coatings is generally between 1 and 1000 nm, preferably between 1 and 500 nm, more preferably between 1 and 100 nm, most preferably between 1 and 50 nm. In some embodiments, the coating thickness is less than 500, 450, 400, 350, 300, 250, 200, 150, 100, 90, 80, 70, 60, 50, 40, 30, 20 or 10 nm.

Spray coating process restricts the deposition of coating to the CNT tips and limits clumping due to capillary forces associated with the drying of the solvent. The amount of coating visible on the CNT arrays increases with the number of sprays. Alternative techniques can be used to spray coat the coating materials onto the CNT arrays including techniques more suitable for coating on a commercial scale.

In another embodiment that demonstrates a coating process, CNT sheets are dipped into coating solutions or melted coatings to coat CNTs throughout the thickness of the sheets, increasing the thermal conductivity of the sheet in the cross-plane direction by greater than 20, 30, 50, or 70%. These coated sheets are then placed between a chip and heat sink or heat spreader with the application of solvent or heat to reflow the polymer and bond the CNT sheet between the chip and heat sink or spreader to reduce the thermal resistance between the chip and heat sink or heat spreader.

In other embodiments, the coating material can be deposited on the CNT array or sheet using deposition techniques known in the art, such as chemical deposition (e.g., chemical vapor deposition (CVD)), aerosol spray deposition, and electrochemical deposition.

In one embodiment, a polymer coating can be applied by electrochemical deposition. In electrochemical deposition, the monomer of the polymer is dissolved in electrolyte and the CNT array or sheet is used as the working electrode, which is opposite the counter electrode. A potential is applied between the working and counter electrode with respect to a third reference electrode. The monomer is electrooxidized on the CNT array tips or sheet sidewalls that face the electrolyte as a result of the applied potential. Controlling the total time in which the potential is applied controls the thickness of the deposited polymer layer.

In some embodiments, the coating material is, or contains, one or more oligomeric and/or polymeric materials. In particular embodiments, the polymer can be a conjugated polymer, including aromatic and non-aromatic conjugated polymers. Suitable classes of conjugated polymers include polyaromatic and polyheteroaromatics including, but not limited to, polythiophenes (including alkyl-substituted polythiophenes), polystyrenes, polypyrroles, polyacetylenes, polyanilines, polyfluorenes, polyphenylenes, polypyrenes, polyazulenes, polynaphthalenes, polycarbazoles, polyindoles, polyazepines, poly(3,4-ethylenedioxythiophenes), poly(p-phenyl sulfides), and poly(p-phenylene vinylene). Suitable non-aromatic polymers include, but are not limited to, polyacetylenes and polydiacetylenes. The polymer classes listed above include substituted polymers, wherein the polymer backbone is substituted with one or more functional groups, such as alkyl groups. In some embodiments, the polymer is polystyrene (PS). In other embodiments, the polymer is poly(3-hexythiophene) (P3HT).

In other embodiments, the polymer is a non-conjugated polymer. Suitable non-conjugated include, but are not limited to, polyvinyl alcohols (PVA), poly(methyl methacrylates) (PMMA), polysiloxanes, polyurethanes, polydimethylsiloxanes (PDMS), and combinations (blends) thereof.

In other embodiments, the polymer is a paraffin wax. In other embodiments, the polymer is a synthetic wax such as Fischer-Tropsch waxes or polyethylene waxes. In other embodiments, the polymer is a wax that has a melting temperature above 80, 90, 100, 110, and 120° C., preferably above 130° C.

In some other embodiments, the polymer is an adhesive, such as, but not limited to, a hot glue or hot melt adhesive that combines wax, tackifiers and a polymer base to provide improved surface adhesion. In some embodiments, the adhesive is a pressure sensitive adhesive. In certain other embodiments the adhesive is a monomer that polymerizes upon contact with air or water such as a cyanoacrylate. In yet other embodiments, the adhesive is a combination of a pressure sensitive adhesive polymer and a thermally activated (or activatable) adhesive polymer which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

2. Metallic Nanoparticles

The CNT arrays or sheets can be coated with one or more metal nanoparticles. One or more metal nanoparticles may be adsorbed to the distal ends and/or sidewalls of the CNTs to bond the distal ends of the CNTs to a surface, reduce thermal resistance between the CNT array or sheet and a surface, or combinations thereof. Metal nanoparticles can be applied to CNT arrays or sheets using a variety of methods known in the art. For example, a solution of metal thiolate such as palladium hexadecanethiolate can be sprayed or spin coated onto the distal ends and/or sidewalls of the CNTs, and the organics can be baked off to leave palladium nanoparticles. In another example, electron-beam or sputter deposition can be used to coat metal nanoparticles or connected "film-like" assemblies of nanoparticles onto the distal ends and/or sidewalls of the CNTs. The metallic particles can be coated simultaneously with the coating or before or after coating.

Examples of suitable metal nanoparticles include palladium, gold, silver, titanium, iron, nickel, copper, and combinations thereof.

3. Flowable or Phase Change Materials

In certain embodiments, flowable or phase change materials can be applied to the CNT array or sheet. Flowable or phase change materials may be added to the CNT array or sheet to displace the air between CNTs and improve contact between the distal ends of CNTs and a surface, and as a result reduce thermal resistance of the array or sheet and the contact between the array or sheet and a surface, or combinations thereof. Flowable or phase change materials can be applied to CNT arrays or sheets using a variety of methods known in the art. For example, flowable or phase change materials in their liquid state can be wicked into a CNT array or sheet by placing the array or sheet in partial or full contact with the liquid.

Examples of suitable flowable or phase change materials include paraffin waxes, polyethylene waxes, hydrocarbon-based waxes in general, and blends thereof. Other examples of suitable flowable or phase change materials that are neither wax nor polymeric include liquid metals, oils, organic-inorganic and inorganic-inorganic eutectics, and blends thereof. In some embodiments, the coating material(s) and the flowable or phase change material are the same.

The coatings, metallic particles, and/or flow or phase change materials described above can be applied directly to the CNT arrays or sheets and the coated CNT arrays or sheets can subsequently be stacked to form multilayered or multitiered structures. In certain other embodiments, the coatings, metallic particles, and/or flow or phase change materials described above are applied during the stacking of two or more CNT arrays or sheets. In still other embodiments, the coatings, metallic particles, and/or flow or phase change materials described above are applied following the stacking of two or more CNT arrays or sheets. In non-limiting embodiments, multilayered or multitiered structure(s) are formed by first stacking two or more CNT arrays or sheets and then the at least partially interdigitated tiers of the formed structures are infiltrated with one or more coatings, metallic particles, and/or flow or phase change materials, or combinations thereof. The introduction of such coatings/materials into the at least partially interdigitated tiers of the multilayered or multitiered structure(s) prior to, during, or after stacking can be used to modify and/or enhance the thermal transport or thermal resistance properties of the multilayered or multitiered structures resulting from the stacking of the CNT arrays or sheets.

D. Multilayered or Multitiered Structures

In the embodiments described herein, the multilayered or multitiered structures formed by stacking of CNT arrays or sheets are formed by a method including the steps of:

(1) providing at least two or more CNT arrays or sheets; and (2) stacking the at least CNT arrays or sheets wherein the stacking results in at least partial interdigitation of the nanostructures, CNTs, of the arrays or sheets. In some embodiments, the method of making the multilayered or multitiered structures further includes a step of applying or infiltrating a coating, a coating of metallic nanoparticles, and/or a coating of flowable or phase change materials, which are described above. In some embodiments, the step of applying or infiltrating a coating, a coating of metallic nanoparticles, and/or a coating of flowable or phase change materials occurs prior to stacking, alternatively during stacking, or alternatively after stacking. In yet other embodiments, the method includes applying pressure during the stacking step. The applied pressure may be in the range of about 1-100 psi, 1-50 psi, 1-30 psi, more preferably about 1-20 psi, and most preferably about 1-15 psi. In some embodiments, the pressure is about 15 psi. Pressure may be applied continuously until the adjacent tiers are bonded, if a coating material(s) which can act as a bonding agent, such as an adhesive or phase change material, is used. Pressure may be applied for any suitable amount of time. In some embodiments, only a short time is used, such as less than 1 minute, if no bonding agent is used.

At least two CNT arrays or sheets can be stacked to form the multilayered or multitiered structures. For example, FIG. 2 shows stacking of three CNT arrays (right side). By using more CNT arrays the thickness of the multilayered or multitiered structures can be increased as needed. In some embodiments, up to 5, 10, 15, 20, 25, 30, or more CNT arrays or sheets can be stacked according to the method described above. The thickness of the resulting multilayered or multitiered structures formed by stacking can be in the range 1-10,000 microns or more.

In certain embodiments, the multilayered or multitiered structures can be formed by stacking multiple tiers of CNT arrays in a stepped manner, off-set manner, and/or other non-uniform manner in order to be able to conform to complex surfaces.

In a non-limiting embodiment, at least two vertically aligned arrays or sheets formed on supports/substrates are stacked/contacted such that the nanostructure elements, such as CNTs, of the arrays at least partially interdigitate on contact. In one embodiment full interdigitation of nanostructure elements of the arrays occurs within one another when stacked. In other embodiments the arrays may interdigitate only at the tips of the nanostructure elements, such as CNTs. In yet other embodiments, the individual nanostructures can navigate through the nanostructures of the adjacent array during the interdigitating process.

In some embodiments the nanostructures of the stacked arrays, which interdigitate at least partially, may also form into larger superstructures, such as, but not limited to, tube bundles, clumps, or rows. These superstructures may be formed through mechanisms such as capillary clumping or by way of application of a polymer coating prior to, during, or following the stacking process.

In some embodiments, a polymer coating and/or adhesive, or other coating as described above, is applied to the CNT array(s) which are then stacked. In such embodiments, the thickness of the coating and/or adhesive, or other coating as described above, is about 1-1000 nm, more preferable 1-500 nm, and most preferably 1-100 nm.

In certain embodiments of the above method, following the stacking step the method further includes a step of applying an adhesive, such as but not limited to a hot glue or hot melt adhesive that combines wax, tackifiers and a polymer base to the resulting stack to provide improved adhesion properties to one or more surfaces of the stacked/tiered CNT arrays forming the multilayered or multitiered structure. In some embodiments, the adhesive is a pressure sensitive adhesive. In yet other embodiments, the adhesive is a combination of a pressure sensitive adhesive polymer and a thermally activated (or activatable) adhesive polymer which enhances ease of adhesion of a multilayered or multitiered structure described herein which includes such a combination of coatings to a surface(s), by way of the pressure sensitive adhesive and additional and more permanent or semi-permanent adhesion by way of the thermal adhesive.

In yet other embodiments, one or more tiers of the stacked arrays described above may be substituted with other materials to afford a composite stack. Such materials include, but are not limited to, solders, greases, adhesives, phase change materials, gels, heat spreaders, compliant pads, and/or (elastomeric) gap pads. The substitution of these materials for one or more CNT array tiers of the multiered or multilayered stacks described can be used to further tune the properties of the resulting composite stack. Such composite stacks may be used for a variety of applications described below, such as thermal interface materials (TIMs).

Yet another option is introduce a dielectric material or induce the formation of a dielectric material within the layers/tiers of stacked arrays in order to convert the resulting composite stack from an electrical conductor into an insulator. Dielectric materials are known in the art, such as ceramic insulating materials. As one example, one or more of the substrates of the CNT arrays present in a multitiered stack, which is formed from aluminum, can oxidized (such as by anodization) to produce an electrically insulating stack.

V. Applications

The multilayered or multitiered structures formed by stacking of CNT arrays or sheets described herein can be used as thermal interface materials (TIMs). The multilayered or multitiered structures formed by stacking of CNT arrays or sheets can be formed and/or deposited, as required for a particular application.

Accordingly, such materials are well suited for applications where repeated cycling is required. For example, they can be employed as thermal interface materials (TIMs) during 'burn-in' testing of electrical components, such as chips or circuits. In some embodiments, the inert support/substrate is a surface of a conventional metal heat sink or spreader. This functionalized heat sink or spreader may then be abutted or adhered to a heat source, such as an integrated circuit package. Such TIM materials can also be placed or affixed in between a heat source and a heat sink or heat spreader, such as between an integrated circuit package and a finned heat exchanger, to improve the transfer of heat from the heat source to the heat sink or spreader.

The high elastic recovery of the multilayered or multitiered structures formed by stacking of CNT arrays or sheets described when further containing an adhesive coating advantageously allows the TIMs formed thereof to maintain intimate contact between surfaces as the surfaces bow or otherwise deform due to thermal expansion. Multilayered or multitiered TIM structures having an adhesive coating can have adhesion strengths of at least about 1000, 750, 500, 450, 400, 350, 300, 250, 200, 150, or 100 psi. The presence of one or more adhesives forming part of the TIMs described generally result in no thermal penalty (i.e., no notable decrease in thermal performance properties) for the TIM, as compared to a TIM lacking the presence of adhesive(s).

The TIM structures formed from the multilayered or multitiered structures formed by stacking of CNT arrays or sheets described herein may also be applied to node multichip modules (MCMs). In particular, the TIM structures may be adjusted to have 2, 3, 4, or more tiers in order to allow for uniform or essentially uniform contact with MCMs. In certain instances it can be difficult to predict or model warpage which may occur in individual chips, circuits, or MCMs during operation at normal temperatures. Warpage can lead to defects and even to failure in certain instances. Accordingly, TIM structures described are particularly suitable for such applications because they can be readily adjusted, if needed, to meet the tolerances required for such applications. As a microchips heat up, they can warp leading to a center to-edge warpage greater than 50 µm whereas in multichip applications, the TIMs described here can accommodate chip-to-chip offsets of 100 µm or more and/or can also accommodate chip center-to-edge warpages of greater than 50 µm.

The CNT arrays and the multilayered or multitiered structures formed by stacking of such CNT arrays described herein can be used as thermal interface materials (TIMs) in personal computers, server computers, memory modules, graphics chips, radar and radio-frequency (RF) devices, disc drives, displays, including light-emitting diode (LED) displays, lighting systems, automotive control units, power-electronics, solar cells, batteries, communications equipment, such as cellular phones, thermoelectric generators, and imaging equipment, including MRIs. The CNT arrays and the multilayered or multitiered structures formed by stacking of such CNT arrays can also be used as efficient heat spreaders when a sufficient number of tiers (i.e., 2, 3, 4, 5, or more tiers) are present such that the substrate that the CNTs are grown on provide an in-plane thermal conductivity which is on par with that of the base material of the substrate, which is typically a metal. In certain embodiments, the multilayered or multitiered structures can be formed by stacking multiple tiers of CNT arrays in a stepped manner, off-set manner, and/or other non-uniform manner in order to more readily conform to complex surfaces, such as those of MCMs, which are typically non-uniform. In such instances, customized multilayered or multitiered structures may be designed and formed by stacking two or more CNT array tiers in a manner that conforms to the complex surface of a given device.

In certain embodiments, the multilayered or multitiered structures formed by stacking of CNT arrays are useful in low contact pressure and/or low pressure applications. Low pressure may refer to ambient pressure or pressures below 1 atm, such as in the range of about 0.01 to less than about 1 atm. In some instances, low pressure may refer to a vacuum such as in aerospace applications where such TIMs could be used in satellites or space vehicles/systems.

In certain embodiments, the multilayered or multitiered structures formed by stacking of CNT arrays are useful at temperatures which are below ambient temperature, below freezing, or at cryogenic temperatures (such as experienced in space).

The CNT arrays and the multilayered or multitiered structures formed by stacking of such CNT arrays described herein can also be used for applications other than heat transfer. Examples include, but are not limited to, microelectronics, through-wafer vertical interconnect assemblies, and electrodes for batteries and capacitors. Currently, copper and aluminum foil are used as the backing materials for the anode and cathode in lithium ion batteries.

The multilayered or multitiered structures formed by stacking of such CNT arrays could also be used for electromagnetic shielding.

EXAMPLES

Example 1. Multilayered/Multitiered CNT-Based Thermal Interface Materials (TIMs)

Methods:

Thermal Measurement System Design

Heat transfer properties for all test specimens were evaluated using a test fixture (not shown) designed and built based on the methods described in ASTM D5470 "Standard Test Method for Thermal Transmission Properties of Thermally Conductive Electrical Insulation Materials." It not only allows for deformation of the test specimens but also incorporates a vacuum chamber to minimize conductive and convective heat losses. The vacuum chamber was constructed of stainless steel with an acrylic door, and is capable of maintaining vacuum in the $10^{-5}$ torr range. The vacuum chamber sits on the reaction plate of a 1000 lb load frame, with all feedthroughs near the top of the chamber. Thermocouples were fed via a pair of Omega 4-pair feedthroughs (8 thermocouples possible). The cooling tubes possess bulkhead fittings with o-ring seals. The power for the heaters were controlled via a Watlow SD controller with a thermocouple feedback loop. The heating block was surrounded by an FR 4 fiberglass insulator shell and the cooling block sits atop a fiberglass insulative plate with machined recessed sections to maintain centrality with the heating block. Both 1"×1" and 4"×4" heating blocks and cooling blocks were fabricated to accommodate planned testing for this program.

Heat Transfer Coefficient Evaluation

Heat transfer evaluations were conducted with a 20° C. differential between the hot and cold meter blocks of the test fixture. It was found that a temperature differential as close as possible to 20° C. was required to drive heat transfer in the system such that accurate results could be obtained. Test data were imported directly from the data output file of the test, which was acquired via LabView. The Thermal Conductivity ($\lambda$) of the meter bars (5005 series Aluminum) was calculated for the specific temperature using the algorithm for aluminum from NIST (E. Marquardt, J. Le, and R. Radebaugh, "Cryogenic Material Properties Database Cryogenic Material Properties Database," 2000).

Heat flow through each individual meter bar was then calculated from Equation 1:

$$Q = (\lambda * A/d)(\delta T) \qquad (1)$$

where Q is the heat flow through the bar, A is cross sectional area, d is the distance between thermocouples and $\delta T$ is the difference in temperature from one thermocouple to the other in Kelvin. The values for the hot and cold meter blocks were then averaged to gain $Q_{TOTAL}$. Thermal impedance in m² K/W was then evaluated through Equation 2:

$$\theta = (A/Q_{AVG}) * \delta T \qquad (2)$$

where $\delta T = T_H - T_C$ is the difference between the specific temperatures at the interface of the evaluated material and the meter blocks, A is the cross sectional area of the material, and Q is the average heat flow through the meter blocks.

Thermal conductivity was then calculated using Equation 3:

$$\lambda = Q_{AVG} * \delta d / A * \delta T \qquad (3)$$

where δd is the change in thickness of the specimen, A is cross sectional area of the specimen and δT is the temperature difference across the specimen in Kelvin.

The heat transfer coefficient of the test specimens was calculated via Equation 4:

$$c = Q_{AVG}/A*\delta T \qquad (4)$$

Sample Fabrication:

CNT arrays were grown on both aluminum (Al) and copper (Cu) substrates using an iron catalyst to evaluate their differences in performance. CNT growth was performed using a low-pressure chemical vapor deposition (LPCVD) process.

Figure 1B:
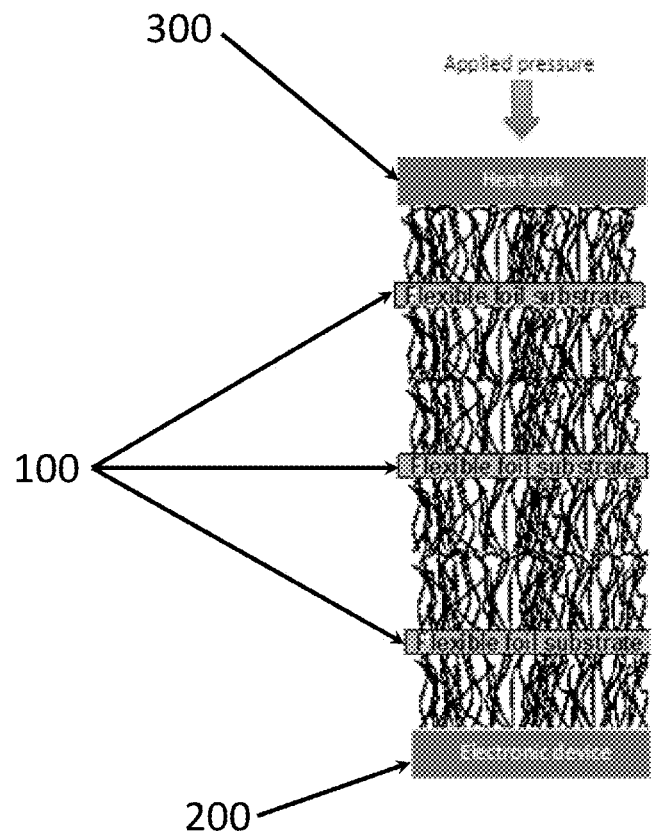

Three different CNT height-foil combinations were tested:
  Series #1-50 micron Al substrate with 50 micron nanotubes on each side
  Series #2-50 micron Al substrate with 75 micron nanotubes on each side
  Series #3-50 micron copper substrate with 150 micron nanotubes on each side In general, the nanotube quality was very good for all lengths fabricated. However as the tube length increased, the presence of defects also increased. Furthermore, the ultimate achievable height of the CNTs was limited by back diffusion of the catalyst into the substrate and diffusion of the substrate into the catalyst stack. For applications where thicker samples with more compliance were required, an increased height of the TIM was achieved by stacking double-sided forests/arrays. As shown schematically in FIGS. 1A and 1B, a thermal interface material (TIM) having a single tier, 100, with arrays of carbon nanotubes, 110, on each side of the substrate and wherein the TIM can be placed between an electronic device, 200, and a heat sink, 300 (FIG. 1A) and a thermal interface material (TIM) having, for example, three tiers, 100, can be placed between an electronic device, 200, and a heat sink, 300.

Two different stack configurations utilizing single TIMs on aluminum (Al) substrates were evaluated. The first configuration, denoted "dry" stack, was assembled from three individual TIMs and then evaluated as prepared. The second stack configuration involved bonding the individual TIMs together at the tube-to-tube interfaces using a very thin sprayed on wax material. These sprayed-on interface materials have been shown to dramatically decrease thermal resistance in CNT-based thermal interface materials. The maximum usable temperature for the synthetic wax is 150° C., well within the expected operating range of these TIMs and the very thin layers (~100 nm) employed are not expected to present any outgassing issues.

All initial evaluations were conducted at ambient pressure with an average temperature of 50° C. and a temperature differential of 20° C. between the heated and cooled meter blocks in the test fixture. Once the thermal performance of the first and second configuration TIM stacks had been verified at ambient pressure, additional testing was conducted under vacuum. A median temperature of 50° C. and a temperature differential of 20° C. were used to enable comparison with ambient pressure data.

Results and Discussion:

Dry Stacks

Actual displacements measured with the instrument crosshead ranged from 430 μm to 480 μm with an applied pressure of 10 kPa (1.5 psi) and from 355 μm to 460 μm with an applied pressure of 69 kPa (10 psi). This suggested some combination of CNT buckling and/or interface interdigitation. It is noted that the displacement measurement is not the same as a true thickness in that it can be difficult to discern exactly the point at which contact to the TIM stack is made for the displacement measurement. CNT buckling and interdigitation of adjacent CNT layers must also be considered. However, exact thickness measurements are not possible using conventional measuring techniques.

Results of heat transfer testing for two dry TIM stacks are shown in FIG. 2. Each specimen was tested through the entire 10-69 kPa (1.5 to 10 psi) pressure cycle twice to assess reproducibility of the dry stacks. For both of the dry stacks tested, there was a substantial improvement in heat transfer after having experienced one pressure cycle. This suggested that an assembly pressure was required in order to ensure good contact between adjacent CNT layers. This demonstrates the improvement in heat transfer resulting from interdigitation.

Wax-Assembled Stacks

In these experiments, three TIM specimens on aluminum substrates, each with a total thickness of approximately 200 μm, were stacked and bonded with a thin wax layer (~100 nm) to provide a TIM assembly of roughly 600 μm (0.024") in thickness. Actual displacements measured with the instrument crosshead were somewhat less than the target thickness.

Figure 3:
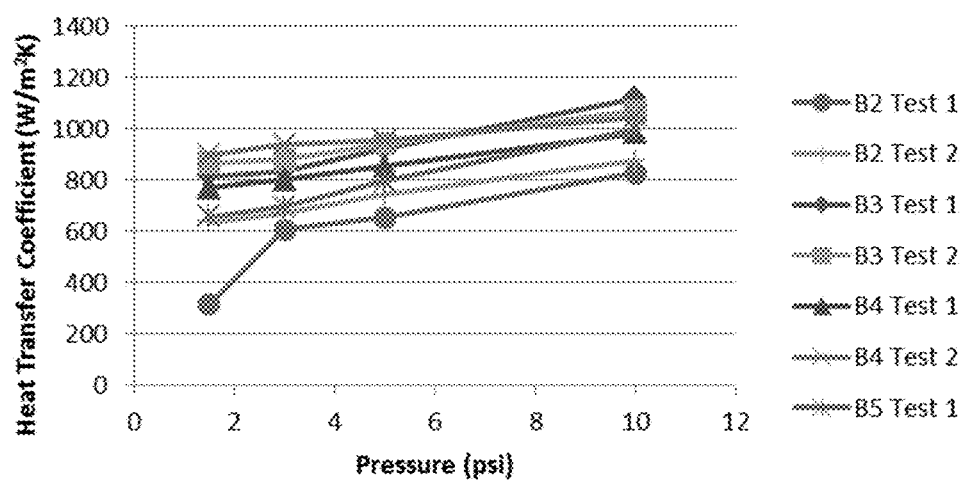
FIG. 3 is a graph showing the heat transfer coefficient for wax-bonded stacks of three TIMs on aluminum (Al) substrates over two test cycles.

Test results for the wax-bonded stacks are provided in FIG. 3. In general, the wax stacks are more consistent in performance than the dry stacks and do not appear to require a "break-in" pressure cycle before performing well. A performance anomaly was noted for specimen B2 at low contact pressure in Test 1; this might be due to insufficient contact between the upper meter block and the specimen in the fixture. Subsequent tests of this particular specimen consistently showed excellent performance. Stacking TIMs, as described herein, allows growing long CNTs on metal substrates, especially when a thin (~nm thick) layer of polymer is used to bond the inter-tier layers and control the level of interdigitation.

Example 2: Multilayered/Multitiered CNT-Based Thermal Interface Materials (TIMs) Containing Polymer or Adhesive CNT arrays were grown to nominally 100 μm thickness and fully infiltrated with a soft polyurethane polymer. The thermal resistance of each individual pad was measured using a modified ASTM D570 stepped bar apparatus.

The individual samples were stacked using various methods, and the thermal resistance of the resulting stack was measured in the same manner as the single tiers.

First, two individual array samples with measured thermal resistances of 1.37 and 1.5 $cm^2$-K/W respectively were stacked on top of one another. Solvent known to dissolve the polymer that was used to infiltrate the array was placed between the stacks to place the interface in a liquid state. The resulting stack was allowed to dry under pressure until the solvent was fully evaporated. The stack was then measured in the stepped bar system with a resulting resistance of 1.5 $cm^2$-K/W. In this example, the thickness of the stacked array was doubled while incurring no penalty in thermal resistance.

In a second experiment, two individual array samples with thermal resistances of 0.45 and 0.66 $cm^2$-K/W respectively were stacked on top of one another. A thin layer of acrylate adhesive was placed between the samples. The sample stack was allowed to dry under pressure until the solvent was fully evaporated. The resulting stack was then measured in the stepped bar system with a resulting resistance of 0.66 cm²-K/W. In this second example, the thickness of the stacked array was also doubled while incurring no penalty in thermal resistance.

Example 3. Multilayered/Multitiered CNT-Based Thermal Interface Materials (TIMs)

Sample Fabrication:

Vertically aligned carbon nanotube (CNT) arrays were grown on aluminum foil as the base substrate. Both sides of 50 µm thick aluminum foil were coated with an iron catalyst layer and the CNTs were grown via low pressure chemical vapor deposition with acetylene and hydrogen as precursor gases and growth being performed at 630° C. in order to stay below the melting temperature of the Al substrate. CNTs were grown to 7-10 µm on both sides of the substrate with an 8 minute growth time. One-tier CNT-based thermal interface material (non-stacked) and two- and four-tiered (formed by stacking two or four double-sided CNT arrays) CNT-based thermal interface materials (TIMs) having an area of 1 cm×1 cm were prepared for testing.

Testing Methods:

In order to measure the thickness, compression, and rebound of the one and three-tiered TIMs prepared, a Precision Thickness Gauge-FT3V by Hanatek® Instruments having a weight platform and a pressure foot (not shown) was used to measure the thickness at different applied pressures. Weights can be added to a weight platform of the instrument that corresponds to an instantaneous change in pressure at the pressure foot of the instrument that the TIM material being tested is placed under. The pressure foot comes down at a rate of 3 mm/s. The thickness was recorded when the TIM material being tested had reached a steady state, which typically took about 1-10 seconds. For a given user applied force, the instrument measured the thickness with an accuracy of +/−0.1 micrometer. The instrument met ASTM-F36-99 standards to test compressibility and recovery of gasket materials. The minimum pressure the gauge of the instrument was able to achieve is 7 psi—the datum pressure. The pressure was then taken up to 100 psi and the thickness was recorded. Then, all pressure was released from the TIM material being tested, and then the 7 psi was re-applied to measure the amount of rebound of the TIM material being tested.

To benchmark the thermal performance of the TIMs, as a function of number of tiers (i.e., one-, two-, and four-tiered CNT-based TIMs), the samples were measured in a modified ASTM-D5470 stepped bar apparatus designed to measure the steady state 1 D thermal resistance of thermally conductive samples. The ASTM-D5470 stepped bar test apparatus is described in detail in D. R. Thompson, S. R. Rao, and B. A. Cola, "A stepped-bar apparatus for thermal resistance measurements," *Journal of Electronic Packaging*, vol. 135, p. 041002, 2013.

The performances of the single and three-tiered CNT-based TIMs were compared to TIMs known in the art. Accordingly a variety of commercially available TIMs were also tested under the same conditions. The commercial TIMs used for benchmarking were: TGARD® 210 (silicone elastomer), TGlobal PC94® (acrylic base), Pyrolytic Graphite (PGS), Fujipoly® SARCON XR-UM-Al (a silicone putty backed with a thin aluminum foil), and Indium Heat Spring (a soft metal). These materials were chosen to represent different TIM compositions, and all possessed a specified thermal conductivity of greater than 4.0 (W/m-K), which is considered state of the art for currently available TIMs.

Compressibility of the tested TIMs was determined according to Formula (5) below:

$$(thickness_{100psi}/thickness_{original}) \quad (5)$$

TIM rebound, wherein in "rebound" as used herein refers to the degree to which a TIM recovers to its original thickness, was determined according to Formula (6) below:

$$\left( \frac{thickness_{post\ compression} - thickness_{100\ psi}}{thickness_{original} - thickness_{100\ psi}} \right) \quad (6)$$

Figure 4:
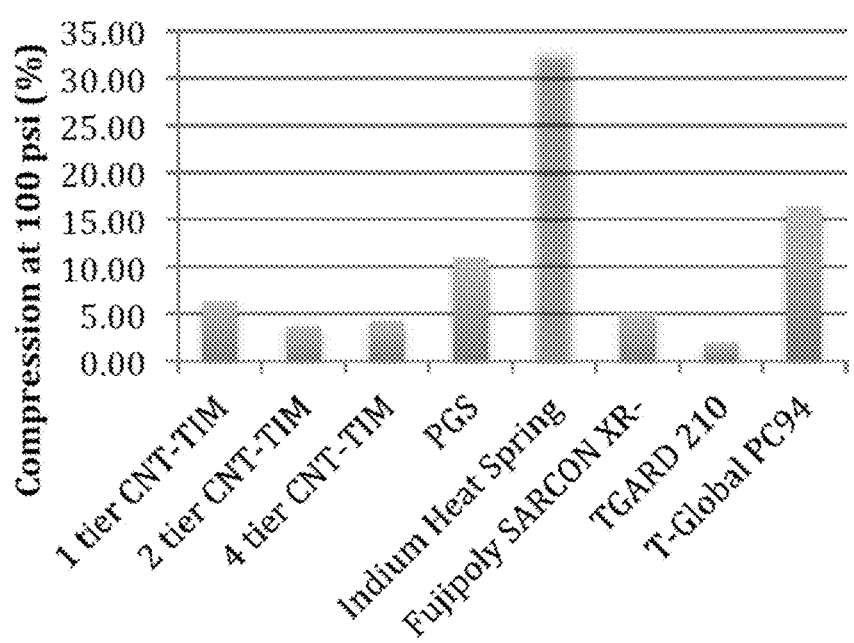
FIG. 4 is a bar graph showing the compressibility of one-, two-, and four-tiered CNT-based TIMs and of several commercially available TIMs. Normalized compression was measured at 100 psi.
Figure 5:
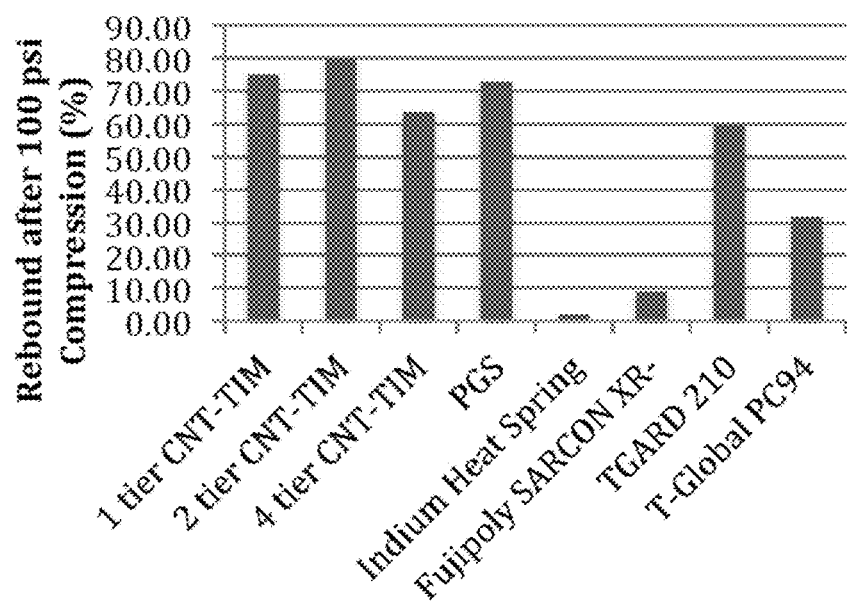
FIG. 5 is a bar graph showing the rebound after compression of one-, two-, and four-tiered CNT-based TIMs and of several commercially available TIMs. TIM normalized rebound was measured at 7 psi following compression to 100 psi.

Results:

FIG. 4 and FIG. 5 show the normalized compression and rebound, respectively of the one-, two-, and four-tiered CNT-based TIMs, as well as the benchmarking commercial TIMs. When looking at commercial TIMs, as shown in FIG. 4, most demonstrated a compressibility of 10% or less, at 100 psi. Stacked two and four-tiered CNT-based TIMs showed a slight drop in compressibility, as compared to a single tiered CNT-based TIM, which is believed to result from inter-digitation of the CNT tips during the stacking process. Indium and the PC94 TIMs had notably higher compressibility at 100 psi at 33% and 16%, respectively. However, these materials have comparatively little rebound after the initial compression. In applications with cyclic heating and cooling, this could lead to undesirable dewetting of the interface during expansion and contraction events.

From a deformation mechanics perspective, the CNT-based TIMS and pyrolytic graphite (PGS) have a good combination of compressibility and rebound after compression. However, a key challenge in the selection of a TIM for applications requiring compliance is that the warpage of a chip or die in the application is not always known. As a means of evaluating the required compliance of an application, one may consider stacking CNT-based TIMs in the interface. Because the CNT-based TIMs do not experience an inter-tier thermal penalty, the effective thermal conductance of the stack increases with each successive tier due to compliance driven increased contact area for applications with a curved interface. Such an effect was shown for CNT-based TIMs having one-, two-, and four-tiers which were successfully compressed on a curved interface (not shown) and which demonstrated that the resulting contact area was clearly increased with each additional tier present. At four tiers, contact appeared to be approximately uniform across the interface.

Figure 6:
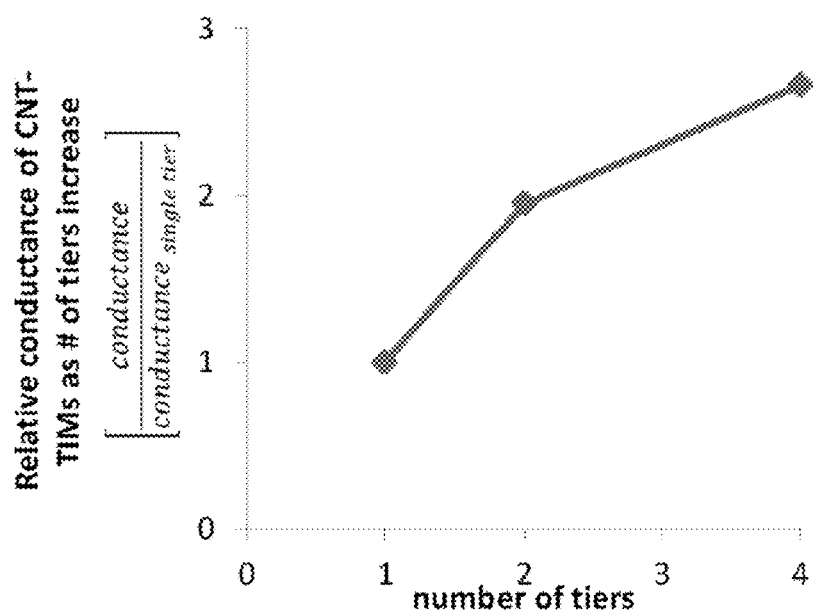
FIG. 6 is a graph showing the effective thermal conductivity of one-tiered and stacked two- and four-tiered TIMs.

When measured in the stepped bar apparatus, the relative thermal conductance of the one-, two-, and four-tiered CNT-TIMs was found to increase by 95% when going from one to two tiers, and an additional 36% when going from two to four tiers (see FIG. 6). Thermal conductivity or conductance can be determined using Eqn. (3) whereas relative thermal conductance is determined according to formula (7) below:

$$\left[ \frac{conductance}{conductance_{single\ tier}} \right] \quad (7)$$

where conductance refers to the conductance of a multitiered TIM. As the bulk conductivity of the CNT-based TIMs did not increase with stacking, this effect was believed to be driven by the increase in contact area that additional compliance allowed for.

In summary, bulk conductivity alone was not sufficient to predict how a TIM would perform at an interface. The compressibility of the TIM was found to be a key factor in evaluating the degree to which the TIM would be able to create good contact at an interface with non-flat surfaces due to warping or warpage, to meet manufacturing tolerances, 2.5 D or 3D architectures, or other scenarios found in varying applications. Furthermore, in applications that may heat and cool cyclically, or where the interface geometry may otherwise change on the microscale over time, TIM rebound required that the interface not de-wet which can result in a loss in performance during operation.

Example 4. Multilayered/Multitiered CNT-Based Thermal

Figure 7:
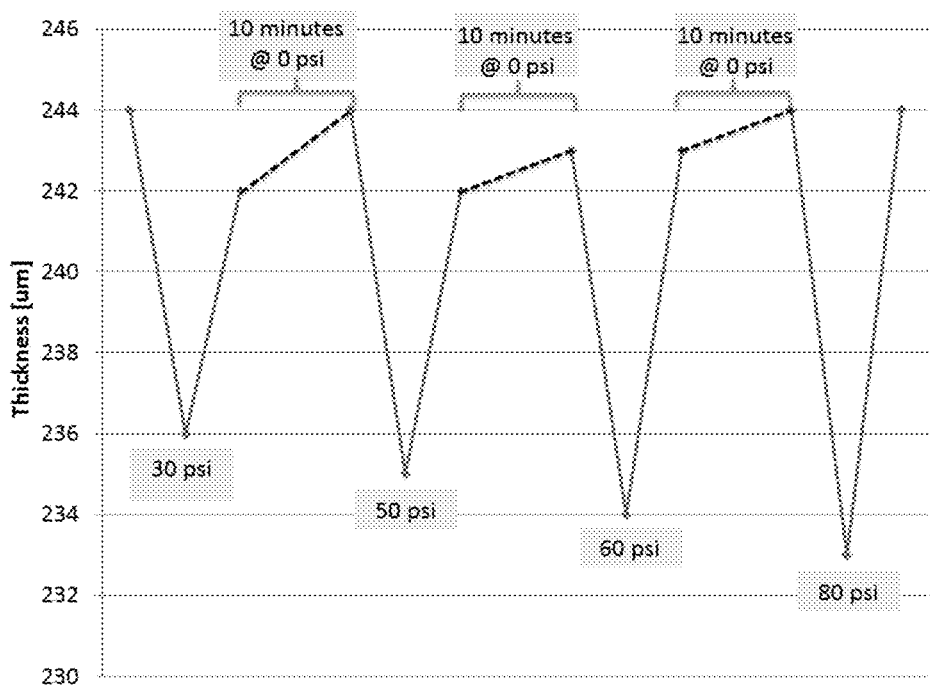
FIG. 7 is a graph showing compliance and compression sets for a CNT-based TIM tested at successive pressures of 30 psi, 50 psi, 60 psi, and 80 psi at a temperature of 80° C.

Interface Materials (TIMs)
Sample Fabrication:
TIMs were prepared as described in Example 3 above.
Testing Methods:
Compliance and compression sets of a CNT-based stacked TIM is shown in FIG. 7, wherein the y-axis shows the change in thickness upon compression to different pressures and recovery upon rest. Several cycles were measured using a Precision Thickness Gauge-FT3V by Hanatek® Instrument, where "at rest" pressure measurements were taken at 7 psi, which is the minimum pressure achievable by the instrument. Dwell times were held for one minute at pressures of 30, 50, 60, or 80 psi. The total time for each test cycle (i.e., at rest-high pressure dwell time-at rest) was less than two minutes. Following each test cycle, the CNT-based stacked TIM was held at 0 psi (i.e., no contact with testing instrument anvil) for a period of ten minutes in order to evaluate the TIM's slow elastic recovery component. All testing was performed at 80° C.

Figure 8:
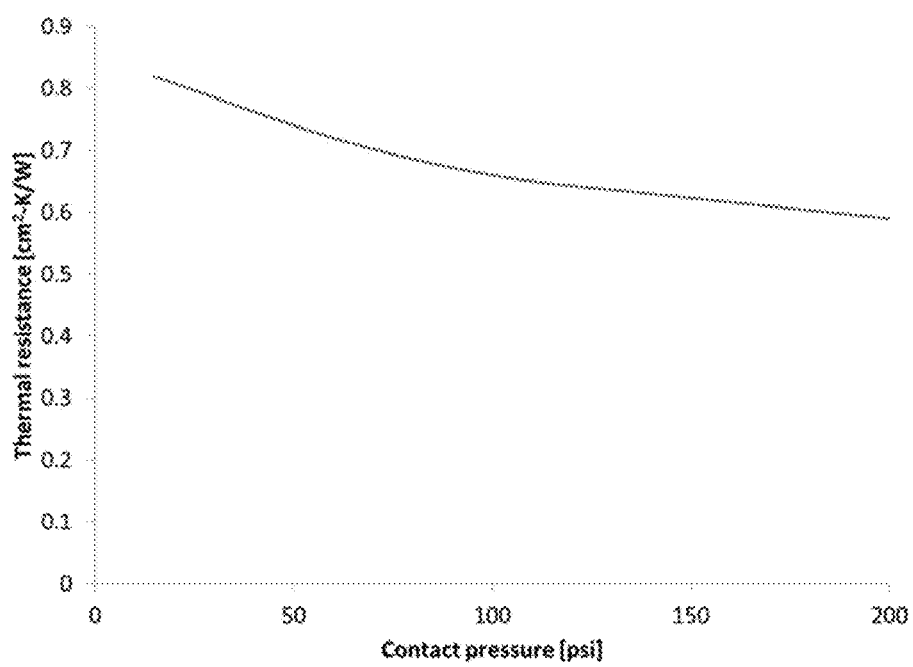
FIG. 8 is a graph showing the effect of increased contact pressure (x-axis) on thermal resistance (y-axis) on a CNT-based stacked TIM.
Figure 9:
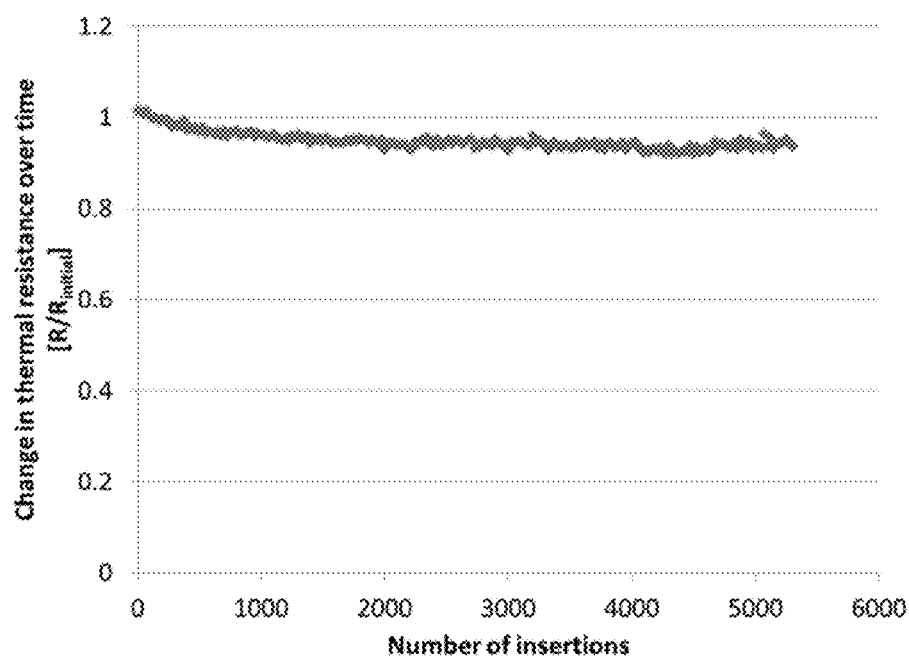
FIG. 9 is a graph showing the change in thermal resistance over time (x-axis) of a CNT-based stacked TIM over greater than 5,000 insertions at a pressure of 80 psi.
Figure 10:
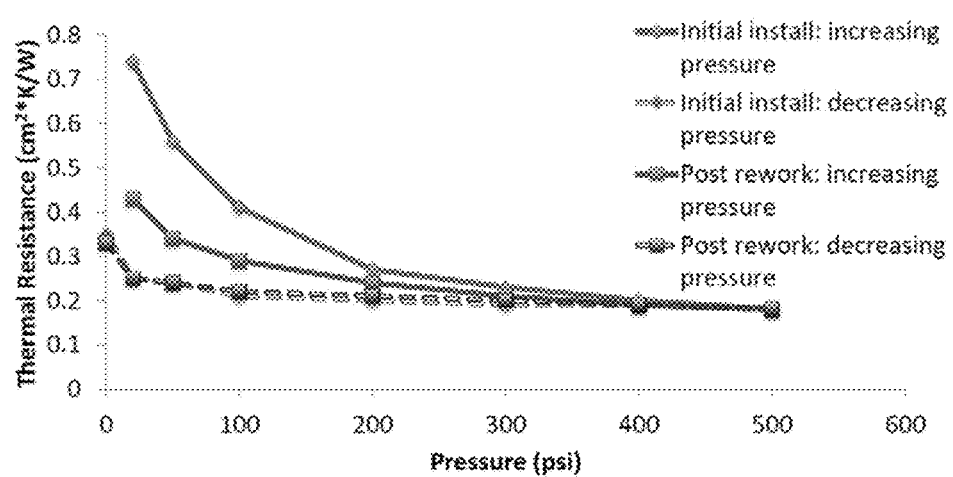
FIG. 10 is a graph showing thermal resistance hysteresis of a CNT-based stacked TIM, upon initial install and post re-work, at pressures of 0 to 500 psi.

Thermal resistance of the CNT-based stacked TIM was measured with a modified ASTM D5470 stepped bar test apparatus (described above). As shown in FIG. 8, the thermal resistance of the CNT-based stacked TIM decreased from about 0.8 $cm^2$-K/W to about 0.6 $cm^2$-K/W upon increasing the contact pressure up to 200 psi. Durability of the thermal performance of the CNT-based stacked TIM was tested by repeated test cycling of the TIM at an interface pressure of 80 psi over greater than 5,000 cycles. As shown in FIG. 9, thermal performance of the CNT-based stacked TIM remained essentially constant over the greater than 5,000 testing cycles showing the durability of the tested TIM. As shown in FIG. 10, thermal resistance hysteresis was found believed to be a result of the superior mechanical properties of CNT-based stacked TIMs which provide for stable operation over a wide pressure range, up to at least 500 psi, with easy rework.

Figure 11:
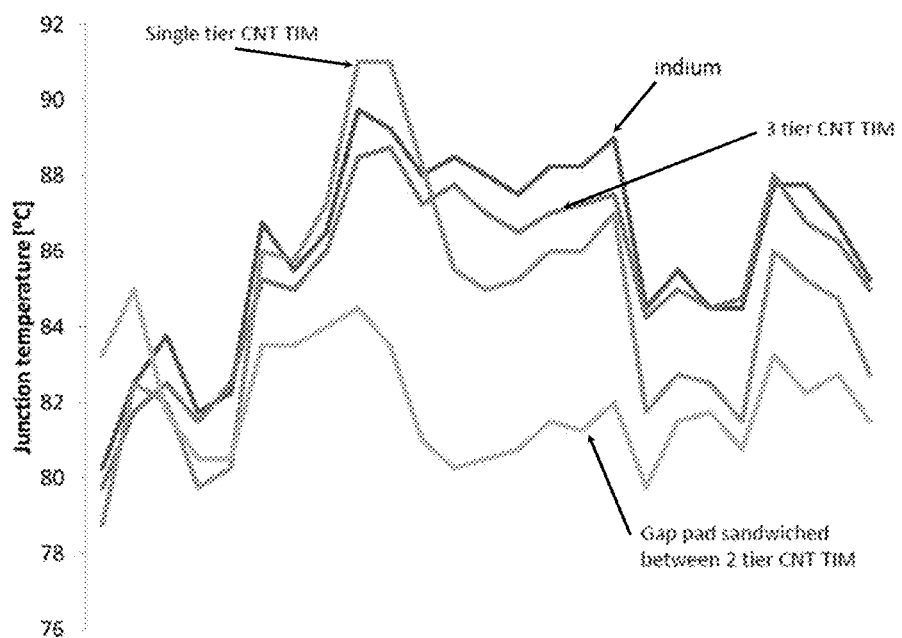
FIG. 11 is a graph of the thermal resistance as a function of junction temperature of a single-tiered CNT-based TIM, a three-tiered CNT-based TIM, a CNT-based TIM wherein a gap pad is sandwiched between two tiers of CNT-based TIM, and an indium benchmarking sample.

FIG. 11 shows the performance of stacked CNT-based TIMs including (1) a single-tiered CNT-based TIM, (2) a three-tiered CNT-based TIM, (3) a CNT-based TIM wherein a gap pad was sandwiched between two tiers of CNT-based TIM, and (4) and an indium benchmarking sample. The thermal resistance when evaluated as a function of junction temperature and it was shown that the stacked CNT-based TIM provided the lowest resistance when a device operates at its highest power due to die warpage, for example. Under certain conditions, stacked CNT-based TIMs can provide additional compliance and heat spreading for hot spots which may be present on a device, such as a chip, die, or MCM.

Figure 12:
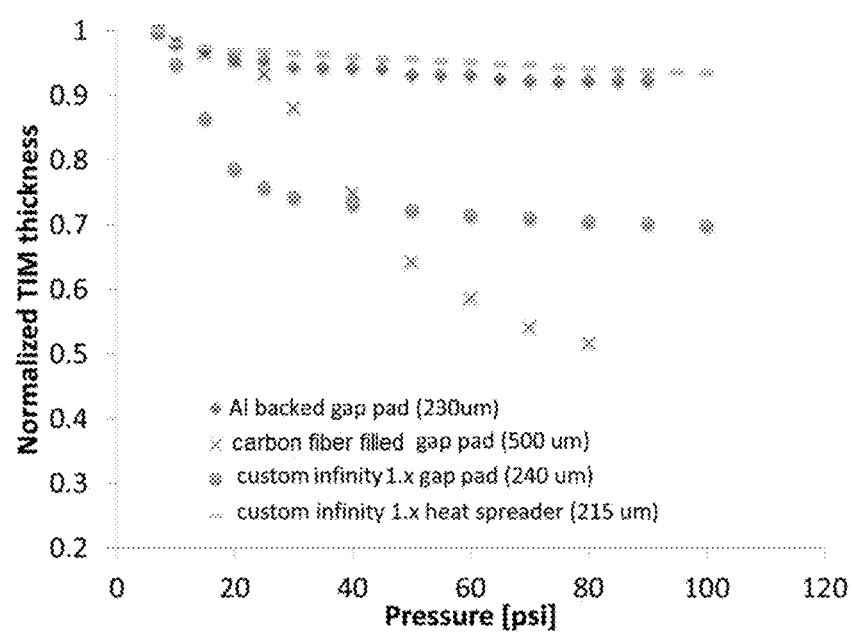
FIG. 12 is a graph showing the normalized thickness of several TIM materials as a function of pressure.

Lastly, FIG. 12 shows the effects of pressure on the normalized thickness of different TIMs including: (1) an aluminum backed gap pad (of 230 μm thickness), (2) a carbon fiber filled gap pad (of 500 μm thickness), (3) a custom stacked CNT-based TIM with an integrated compliant material, and (4) a custom stacked CNT-based TIM with an integrated heat spreader. Custom stacked CNT-based TIMs which include additional integrated materials, such as heat spreaders, graphite, and/or gap pads, allow for further customization of the resulting TIMs for use in particular applications having particular and/or unique mechanical and/or performance requirements.

Unless defined otherwise, all technical and scientific terms used herein have the same meanings as commonly understood by one of skill in the art to which the disclosed invention belongs. Publications cited herein and the materials for which they are cited are specifically incorporated by reference.

Those skilled in the art will recognize, or be able to ascertain using no more than routine experimentation, many equivalents to the specific embodiments of the invention described herein. Such equivalents are intended to be encompassed by the following claims.

We claim:

1. A method of forming a multilayered or multitiered structure comprising the steps of:
   providing at least two planar substrates, each independently comprising vertically aligned carbon nanotubes grown from opposing surfaces of the planar substrate; and
   stacking the at least two planar substrates;
   wherein the stacking results in at least partial interdigitation between the vertically aligned carbon nanotubes of each of the at least two planar substrates; and
   wherein the multilayered or multitiered structure, when contacted with one or more surfaces of a material, conforms to asperities present on the one or more surfaces of the material.

2. The method of claim 1, further comprising a step of applying a coating material or infiltrating a coating material onto the vertically aligned carbon nanotubes of the at least two planar substrates prior to, during, or after the stacking step.

3. The method of claim 1, further comprising applying pressure in the range of between about 1 and 15 psi during the stacking step.

4. The method of claim 1, wherein the at least two planar substrates are formed of metal.

5. The method of claim 2, wherein at least some of the interstitial space between the vertically aligned carbon nanotubes, surfaces of the vertically aligned carbon nanotubes, or both, of each of the at least two planar substrates is infiltrated with the coating material, which is solidified within the vertically aligned carbon nanotubes of the arrays.

6. The method of claim 2, wherein the coating material reduces the resistance to energy transport between the at least partially interdigitated vertically aligned carbon nanotubes interfacing between the stacked at least two planar substrates.

7. The method of claim 2, wherein the vertically aligned carbon nanotubes interfacing between the stacked at least two planar substrates are chemically bonded by the coating material which is an adhesive, a phase change material, or a combination thereof.

8. The method of claim 7, wherein the adhesive comprises a combination of a pressure sensitive adhesive and a thermally activatable adhesive.

9. The method of claim 7, wherein the stacked at least two planar substrates are bonded by reflowing the coating material by applying heat or a solvent, followed by a step of drying.

10. The method of claim 1, wherein the multilayered or multitiered structure comprises three, four, or five layers of the planar substrates.

11. The method of claim 1, wherein the multilayered or multitiered structure is a thermal interface material.

12. The method of claim 1, wherein the thermal interface material has an adhesion strength of up to about 1,000 psi.

13. The method of claim 11, wherein the thermal interface material further comprises including a layer or tier formed of a material selected from the group consisting of a heat spreader, a compliant pad, and a gel present within the multilayered or multitiered structure.

14. The method of claim 11, wherein the thermal interface material further comprises including a dielectric layer present within the multilayered or multitiered structure.

15. The method of claim 1, further comprising including a layer or tier formed of a material selected from the group consisting of a heat spreader, a compliant pad, and a gel which is present within the multilayered or multitiered structure.

16. A multilayered or multitiered structure formed by the method of claim 1.

* * * * *